US010802911B2

(12) United States Patent
Shulkin et al.

(10) Patent No.: US 10,802,911 B2
(45) Date of Patent: *Oct. 13, 2020

(54) NON-VOLATILE STORAGE WITH WEAR-ADJUSTED FAILURE PREDICTION

(71) Applicant: WESTERN DIGITAL TECHNOLOGIES, INC., San Jose, CA (US)

(72) Inventors: Arthur Shulkin, Yavne (IL); David Rozman, Kiryat Malakhi (IL); Tomer Eliash, Kfar Saba (IL)

(73) Assignee: Western Digital Technologies, Inc., San Jose, CA (US)

( * ) Notice: Subject to any disclaimer, the term of this patent is extended or adjusted under 35 U.S.C. 154(b) by 43 days.

This patent is subject to a terminal disclaimer.

(21) Appl. No.: 15/927,796

(22) Filed: Mar. 21, 2018

(65) Prior Publication Data

US 2019/0056994 A1  Feb. 21, 2019

Related U.S. Application Data

(63) Continuation-in-part of application No. 15/679,025, filed on Aug. 16, 2017, now Pat. No. 10,346,232.

(51) Int. Cl.
*G06F 11/00* (2006.01)
*G06F 11/10* (2006.01)
(Continued)

(52) U.S. Cl.
CPC ...... *G06F 11/1068* (2013.01); *G06F 11/1048* (2013.01); *G11C 16/3495* (2013.01);
(Continued)

(58) Field of Classification Search
CPC .... G06F 11/106; G06F 11/073; G06F 11/076; G11C 13/003; G11C 13/0033; G11C 13/0035
See application file for complete search history.

(56) References Cited

U.S. PATENT DOCUMENTS 9,460,799 B1 * 10/2016 Costa ................. G11C 16/16
2003/0065990 A1 * 4/2003 Barford ............ G06F 11/221
714/704

(Continued)

OTHER PUBLICATIONS

Mielke, "Bit Error Rate in NAND Flash Memories" 2008, IEEE; Annual International Reliability Physics Symposium, p. 9-19 (Year: 2008).*

*Primary Examiner* — Bryce P Bonzo
*Assistant Examiner* — Jeison C Arcos
(74) *Attorney, Agent, or Firm* — Vierra Magen Marcus LLP

(57) ABSTRACT

A non-volatile storage apparatus includes a set of non-volatile memory cells and one or more control circuits in communication with the set of non-volatile memory cells. The one or more control circuits are configured to collect failure bit counts (FBCs) for data read from the set of non-volatile memory cells in a first time period and manage the set of non-volatile memory cells according to a probability of occurrence of a target FBC in a second time period that is subsequent to the first time period. The probability of occurrence of the target FBC during the second time period is calculated from a model of FBC distribution change of the set of non-volatile memory cells.

21 Claims, 24 Drawing Sheets

(51) Int. Cl.
  *G11C 29/52* (2006.01)
  *G11C 16/34* (2006.01)
  *G11C 16/26* (2006.01)
  *G11C 16/04* (2006.01)
  *G11C 29/04* (2006.01)

(52) U.S. Cl.
  CPC .......... *G11C 29/52* (2013.01); *G11C 16/0483* (2013.01); *G11C 16/26* (2013.01); *G11C 2029/0409* (2013.01); *G11C 2029/0411* (2013.01)

(56) References Cited

U.S. PATENT DOCUMENTS

| | | | | |
|---|---|---|---|---|
| 2004/0128591 A1* | 7/2004 | Ihs | .................. | G01R 31/31709 714/704 |
| 2004/0240521 A1* | 12/2004 | Jard | .................. | H04B 1/7113 375/130 |
| 2005/0043912 A1* | 2/2005 | Kang | .................. | G11C 29/56 702/117 |
| 2007/0074149 A1* | 3/2007 | Ognev | .................. | G06F 11/366 717/101 |
| 2010/0002556 A1* | 1/2010 | Miyashita | .................. | G11B 20/10009 369/53.31 |
| 2010/0122148 A1* | 5/2010 | Flynn | .................. | G06F 11/108 714/773 |
| 2010/0195462 A1* | 8/2010 | Minemura | .................. | G11B 20/10009 369/53.31 |
| 2010/0296350 A1* | 11/2010 | Kim | .................. | G11C 11/5642 365/189.15 |
| 2012/0017138 A1* | 1/2012 | Erez | .................. | G06F 11/221 714/773 |
| 2012/0216094 A1* | 8/2012 | Yoo | .................. | G06F 11/1068 714/758 |
| 2013/0024641 A1* | 1/2013 | Talagala | .................. | G06F 11/3485 711/170 |
| 2013/0173972 A1* | 7/2013 | Kubo | .................. | G11C 16/00 714/718 |
| 2014/0136755 A1* | 5/2014 | Hyde | .................. | A61B 5/6846 711/103 |
| 2014/0136915 A1* | 5/2014 | Hyde | .................. | G06F 11/0703 714/747 |
| 2014/0281803 A1* | 9/2014 | Hsueh | .................. | G06F 11/0793 714/763 |
| 2015/0179272 A1* | 6/2015 | Kim | .................. | G11C 16/26 365/185.03 |
| 2015/0301933 A1* | 10/2015 | Tuers | .................. | G06F 11/1048 714/773 |
| 2015/0370701 A1* | 12/2015 | Higgins | .................. | G06F 12/0253 711/103 |
| 2016/0179597 A1* | 6/2016 | Gorobets | .................. | G06F 3/0653 714/704 |
| 2016/0179697 A1* | 6/2016 | Park | .................. | G06F 12/1009 711/206 |
| 2016/0180951 A1* | 6/2016 | Darragh | .................. | G06F 3/0653 365/185.11 |
| 2016/0217860 A1* | 7/2016 | Lai | .................. | G11C 11/5628 |
| 2017/0091028 A1* | 3/2017 | Golan | .................. | G11C 16/349 |
| 2017/0109276 A1* | 4/2017 | Lee | .................. | G06F 12/0253 |
| 2017/0117035 A1* | 4/2017 | Mokhlesi | .................. | G11C 11/5628 |
| 2017/0330635 A1* | 11/2017 | Shepard | .................. | G11C 29/76 |
| 2018/0159560 A1* | 6/2018 | Sharon | .................. | G06F 3/067 |

* cited by examiner

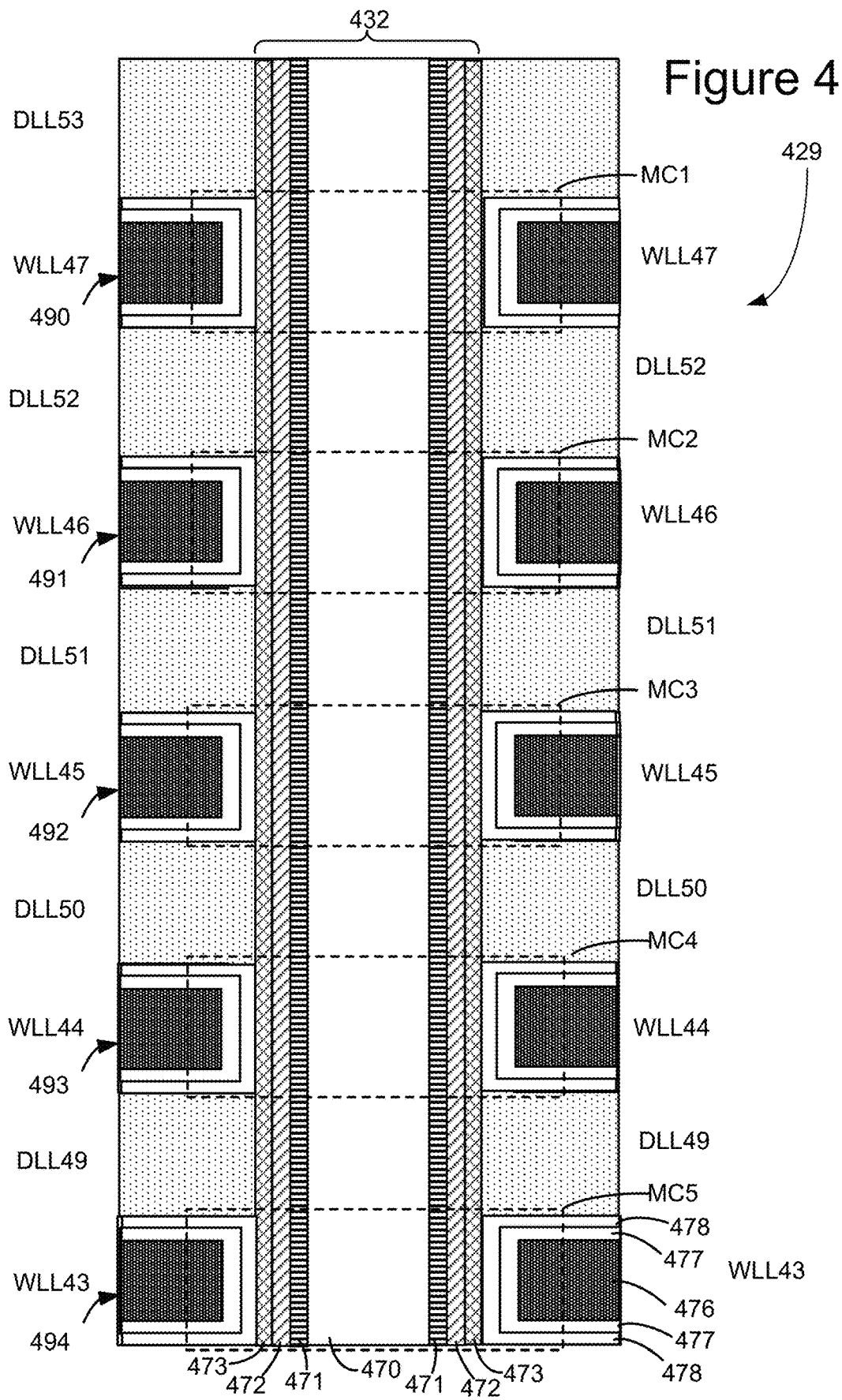

| Z | Prob = $1/(e^z + 1)$ |
|---|---|
| 40 | 4.25E-18 |
| 35 | 6.31E-16 |
| 30 | 9.36E-14 |
| 25 | 1.39E-11 |
| 20 | 2.06E-09 |
| 15 | 3.06E-07 |
| 10 | 4.54E-05 |
| 5 | 6.69E-03 |
| 0 | 5.00E-01 |
| -5 | 9.93E-01 |
| -10 | 1.00E+00 |

NON-VOLATILE STORAGE WITH WEAR-ADJUSTED FAILURE PREDICTION

RELATED APPLICATIONS

This application is a continuation-in-part of U.S. patent application Ser. No. 15/679,025, filed on Aug. 16, 2017, published as U.S. 2019/0056981 on Feb. 21, 2019 and issued as U.S Pat. No. 10,346,232 on Jul. 9, 2019, which application is hereby incorporated by reference in its entirety.

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

A charge-trapping material can be used in non-volatile memory devices to store a charge which represents a data state. The charge-trapping material can be arranged vertically in a three-dimensional (3D) stacked memory structure. One example of a 3D memory structure is the Bit Cost Scalable (BiCS) architecture which comprises a stack of alternating conductive and dielectric layers. A memory hole is formed in the stack and a vertical NAND string is then formed by filling the memory hole with materials including a charge-trapping layer to create a vertical column of memory cells. Each memory cell can store one or more bits of data.

When a memory system is deployed in an electronic device, the memory system may program data, store data, read data and/or erase data. Errors may occur when data is programmed, stored, and read. Errors may be detected and corrected by Error Correction Code (ECC) circuits. If the number of errors is high, errors may not be correctable by ECC.

BRIEF DESCRIPTION OF THE DRAWINGS

Like-numbered elements refer to common components in the different figures.

FIG. 4E is a cross sectional view of a vertical column of memory cells.

DETAILED DESCRIPTION

Figure 1:
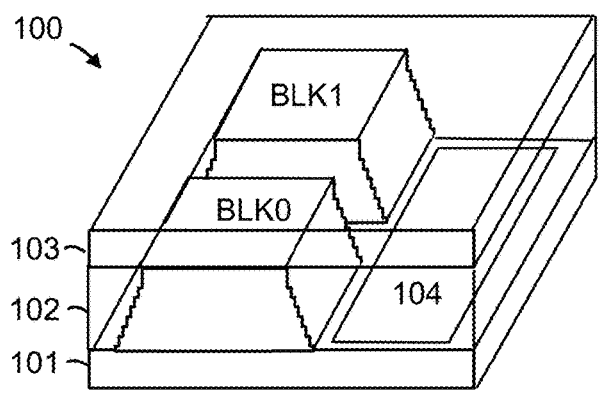
FIG. 1 is a perspective view of a 3D stacked non-volatile memory device.

In a non-volatile memory system, when data is corrected by ECC, the numbers of bad bits may be used to obtain data about physical units in a non-volatile memory array. For example, the number of bad bits (flipped bits) detected by ECC may be recorded as a Failed Bit Count (FBC). This may be done for physical units in a memory array, such as word lines, blocks, planes, dies, or other units. Recorded data may then be analyzed to obtain probabilities for events such as occurrence of a particular FBC. In general, statistical analysis is based on an adequate sample population (e.g. using millions of samples to obtain probabilities of the order of one in a million, or $10^{-6}$). However, acquiring and analyzing such large sample populations may require significant time and resources. Analysis may be done in a simple manner from a small sample population by using an analytic function such as a Fermi-Dirac function to extrapolate from a sample population to model a wide range of events, including events with low probability (e.g. using of the order of 100 samples to predict probabilities of the order of $10^{-7}$). For example, metrics such as mean and standard deviation of an FBC distribution (e.g. a complementary cumulative distribution function, or 1-CDF) may be combined with a target FBC to generate an indicator that is then used to obtain probability from a simple table that links indicator values with probabilities. In this way, an estimate of probability for an event with a low probability (e.g. of the order of $10^{-7}$ or lower) may be generated from a relatively small sample size (much less than $10^{-7}$, e.g. $10^2$) in a simple manner. This may allow testing to be performed rapidly and cheaply (e.g. using hundreds of data points instead of tens of millions to predict events with a probability of the order of $10^{-7}$). This approach may also be implemented in control circuits within a non-volatile memory system (instead of, or in addition to implementation in external text equipment) so that FBC data is updated and probability values are recalculated during use to reflect changes in characteristics over time.

Probability data may be used in memory management in a number of ways. Blocks may be identified as bad blocks, and may be replaced, based on their probabilities of having a target FBC (e.g. target FBC associated with failure) so that blocks may be replaced before failure occurs. Blocks may be chosen for wear leveling, or garbage collection, according to their probabilities of having a target FBC. Voltages applied to memory array components may be adjusted according to probabilities of a target FBC. For example, read threshold voltages may be adjusted where probability of a target FBC exceeds a predetermined value. Data may be identified for read scrub operations according to probabilities of a target FBC.

FBC probability may be calculated from FBC data on an ongoing basis and/or may be predicted in advance based on FBC data from an earlier period of time. FBC data may be obtained during an initial period of time (e.g. during testing) and used to predict an FBC distribution at some subsequent period of time. Such prediction may be used instead of, or in combination with collection of FBC data and generation of FBC probabilities from FBC data during the lifetime of the non-volatile memory. The distribution of FBC data for a given non-volatile memory (e.g. for word lines, blocks, dies or other units) may change over the lifetime of the non-volatile memory in a predictable manner that allows an initial population sample to generate predictions for FBC probabilities throughout the lifetime of the non-volatile memory. Such predictions may be used to manage various non-volatile memory operations such as garbage collection, wear leveling, read threshold voltage adjustment, power management, and ECC correction.

FIGS. 1-4F describe one example of a memory system that can be used to implement the technology proposed herein. FIG. 1 is a perspective view of a three-dimensional (3D) stacked non-volatile memory device. The memory device 100 includes a substrate 101. On and above the substrate are example blocks of cells, including BLK0 and BLK1, formed of memory cells (non-volatile storage elements). Also on substrate 101 is peripheral area 104 with support circuits for use by the blocks. Substrate 101 can also carry circuits under the blocks, along with one or more lower metal layers which are patterned in conductive paths to carry signals of the circuits. The blocks are formed in an intermediate region 102 of the memory device. In an upper region 103 of the memory device, one or more upper metal layers are patterned in conductive paths to carry signals of the circuits. Each block of cells comprises a stacked area of memory cells, where alternating levels of the stack represent word lines. While two blocks are depicted as an example, additional blocks can be used, extending in the x- and/or y-directions.

In one example implementation, the length of the plane in the x-direction, represents a direction in which signal paths for word lines extend (a word line or SGD line direction), and the width of the plane in the y-direction, represents a direction in which signal paths for bit lines extend (a bit line direction). The z-direction represents a height of the memory device.

Figure 2:
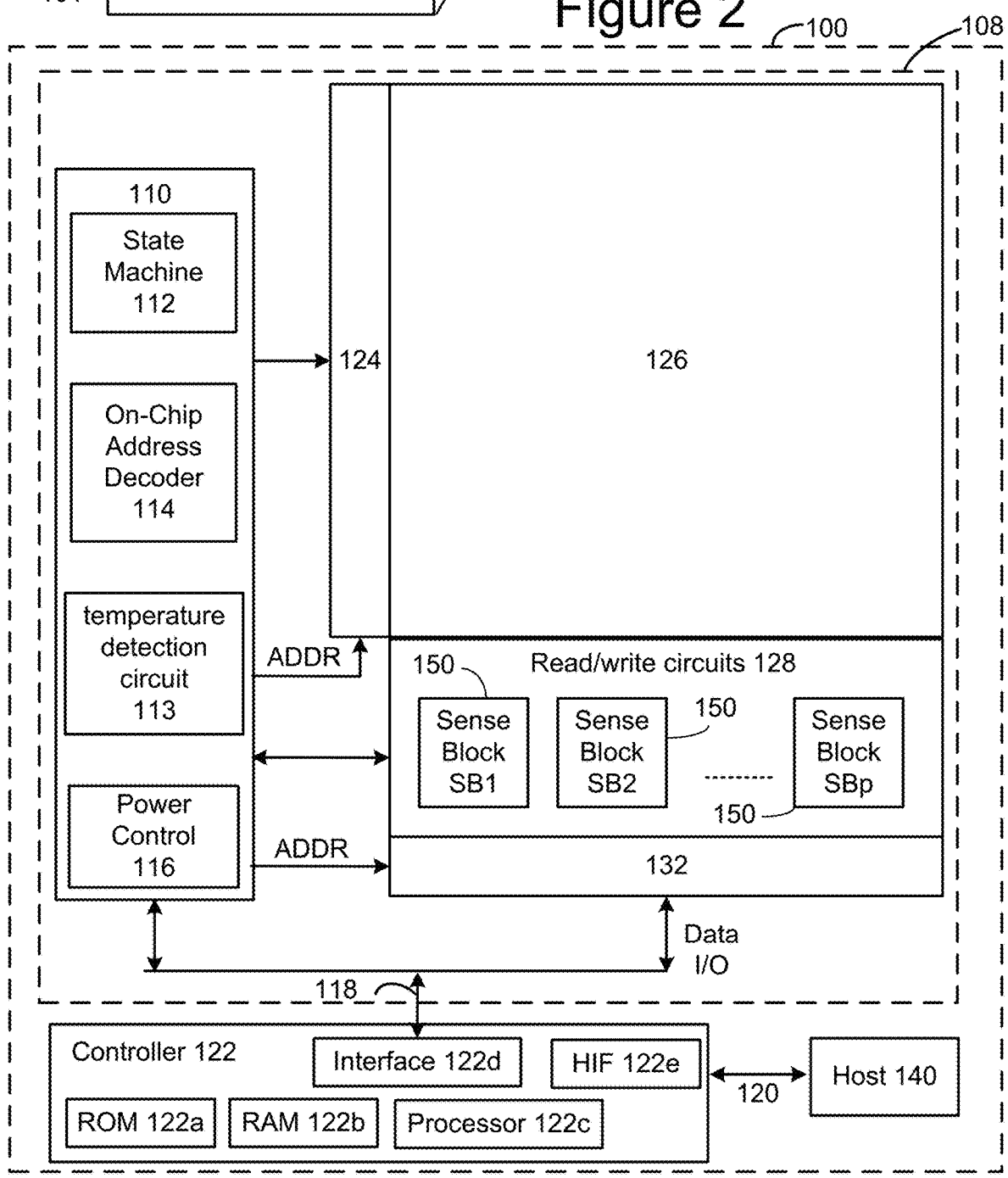
FIG. 2 is a functional block diagram of a memory device such as the 3D stacked non-volatile memory device 100 of FIG. 1.

FIG. 2 is a functional block diagram of an example memory device such as the 3D stacked non-volatile memory device 100 of FIG. 1. The components depicted in FIG. 2 are electrical circuits. Memory device 100 includes one or more memory die 108. Each memory die 108 includes a three-dimensional memory structure 126 of memory cells (such as, for example, a 3D array of memory cells), control circuitry 110, and read/write circuits 128. In other embodiments, a two-dimensional array of memory cells can be used. Memory structure 126 is addressable by word lines via a decoder 124 (row decoder) and by bit lines via a column decoder 132. The read/write circuits 128 include multiple sense blocks 150 including SB1, SB2, . . . , SBp (sensing circuitry) and allow a page of memory cells to be read or programmed in parallel. In some systems, a Controller 122 is included in the same memory device, such as memory device 100 (e.g., a removable storage card) as the one or more memory die 108. However, in other systems, the Controller can be separated from the memory die 108. In some embodiments, the Controller will be on a different die than the memory die. In some embodiments, one Controller 122 will communicate with multiple memory die 108. In other embodiments, each memory die 108 has its own Controller. Commands and data are transferred between the host 140 and Controller 122 via a data bus 120, and between Controller 122 and the one or more memory die 108 via lines 118. In one embodiment, memory die 108 includes a set of input and/or output (I/O) pins that connect to lines 118.

Memory structure 126 may comprise one or more arrays of memory cells including a 3D array. The memory structure may comprise a monolithic three-dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

Control circuitry 110 cooperates with the read/write circuits 128 to perform memory operations (e.g., erase, program, read, and others) on memory structure 126, and includes a state machine 112, an on-chip address decoder 114, and a power control module 116. The state machine 112 provides chip-level control of memory operations. Temperature detection circuit 113 is configured to detect temperature, and can be any suitable temperature detection circuit known in the art. In one embodiment, state machine 112 is programmable by the software. In other embodiments, state machine 112 does not use software and is completely implemented in hardware (e.g., electrical circuits). In one embodiment, control circuitry 110 includes registers, ROM fuses and other storage devices for storing default values such as base voltages and other parameters.

The on-chip address decoder 114 provides an address interface between addresses used by host 140 or Controller 122 to the hardware address used by the decoders 124 and 132. Power control module 116 controls the power and voltages supplied to the word lines and bit lines during memory operations. It can include drivers for word line layers (discussed below) in a 3D configuration, select transistors (e.g., SGS and SGD transistors, described below) and source lines. Power control module 116 may include charge pumps for creating voltages. The sense blocks include bit line drivers. An SGS transistor is a select gate transistor at a source end of a NAND string, and an SGD transistor is a select gate transistor at a drain end of a NAND string.

Any one or any combination of control circuitry 110, state machine 112, decoders 114/124/132, temperature detection circuit 113, power control module 116, sense blocks 150, read/write circuits 128, and Controller 122 can be considered one or more control circuits (or a managing circuit) that performs the functions described herein.

The (on-chip or off-chip) Controller 122 (which in one embodiment is an electrical circuit) may comprise one or more processors 122c, ROM 122a, RAM 122b, Memory Interface 122d and Host Interface 122e, all of which are interconnected. One or more processors 122C is one example of a control circuit. Other embodiments can use state machines or other custom circuits designed to perform one or more functions. The storage devices (ROM 122a, RAM 122b) comprises code such as a set of instructions, and the processor 122c is operable to execute the set of instructions to provide the functionality described herein. Alternatively, or additionally, processor 122c can access code from a storage device in the memory structure, such as a reserved area of memory cells connected to one or more word lines. Memory interface 122d, in communication with ROM 122a, RAM 122b and processor 122c, is an electrical circuit that provides an electrical interface between Controller 122 and memory die 108. For example, memory interface 122d can change the format or timing of signals, provide a buffer, isolate from surges, latch I/O, etc. Processor 122C can issue commands to control circuitry 110 (or any other component of memory die 108) via Memory Interface 122d. Host Interface 122e in communication with ROM 122a, RAM 122b and processor 122c, is an electrical circuit that provides an electrical interface between Controller 122 and host 140. For example, Host Interface 122e can change the format or timing of signals, provide a buffer, isolate from surges, latch I/O, etc. Commands and data from host 140 are received by Controller 122 via Host Interface 122e. Data sent to host 140 are transmitted via Host Interface 122e.

Multiple memory elements in memory structure 126 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors.

A NAND flash memory array may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three-dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in they direction) with each column having multiple memory cells. The vertical columns may be arranged in a two-dimensional configuration, e.g., in an x-y plane, resulting in a three-dimensional arrangement of memory cells, with memory cells on multiple vertically stacked memory planes. Other configurations of memory elements in three dimensions can also constitute a three-dimensional memory array.

By way of non-limiting example, in a three-dimensional NAND memory array, the memory elements may be coupled together to form vertical NAND strings that traverse across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
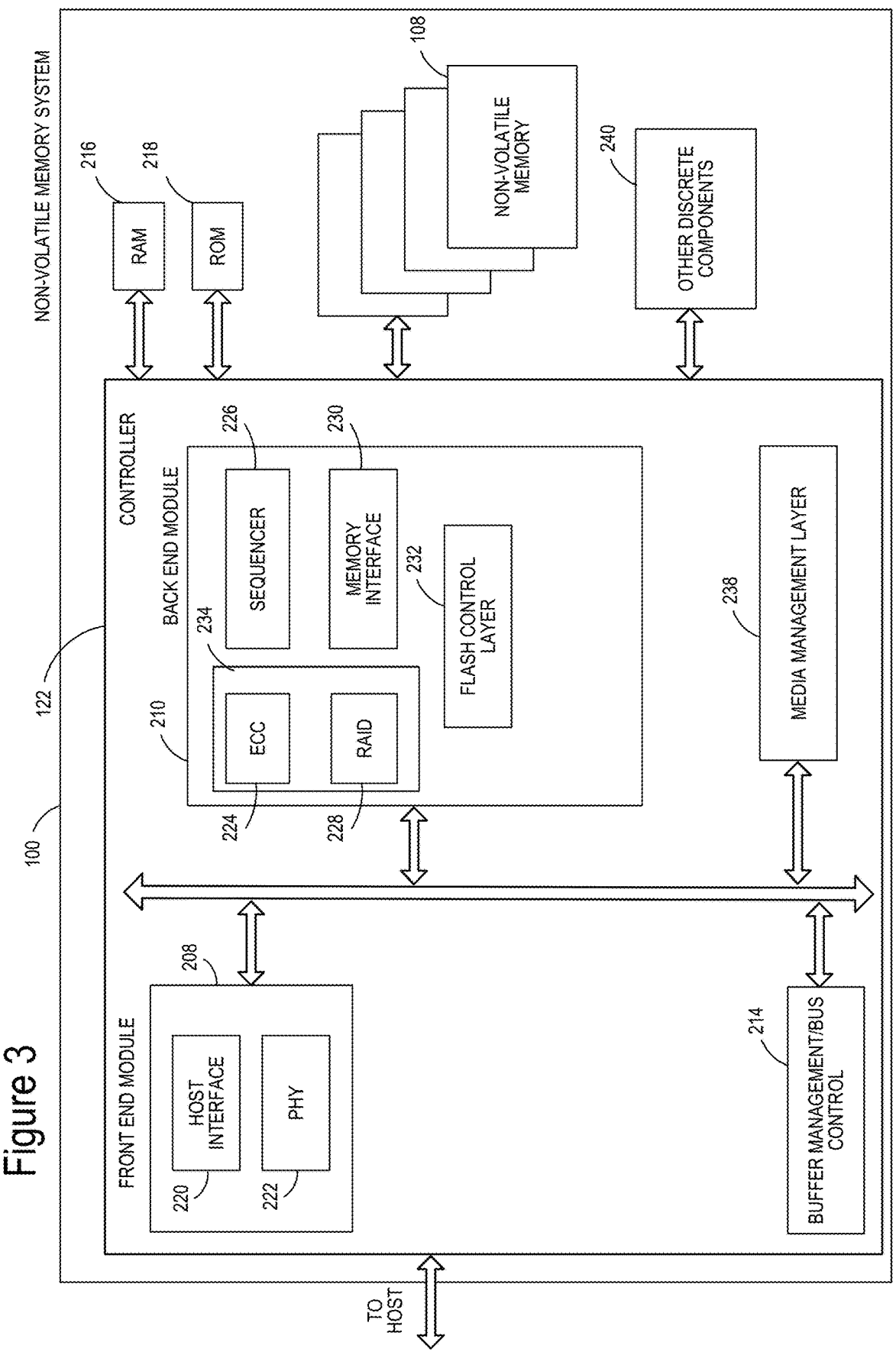
FIG. 3 is a block diagram depicting one embodiment of a Controller.

FIG. 3 is a block diagram of example memory system 100, depicting more details of Controller 122. In one embodiment, the system of FIG. 3 is a solid-state drive (SSD). As used herein, a flash memory Controller is a device that manages data stored on flash memory and communicates with a host, such as a computer or electronic device. A flash memory Controller can have various functionality in addition to the specific functionality described herein. For example, the flash memory Controller can format the flash memory to ensure the memory is operating properly, map out bad flash memory cells, and allocate spare memory cells to be substituted for future failed cells. Some part of the spare cells can be used to hold firmware to operate the flash memory Controller and implement other features. In operation, when a host needs to read data from or write data to the flash memory, it will communicate with the flash memory Controller. If the host provides a logical address to which data is to be read/written, the flash memory Controller can convert the logical address received from the host to a physical address in the flash memory. (Alternatively, the host can provide the physical address). The flash memory Controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The communication interface between Controller 122 and non-volatile memory die 108 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system. For example, the flash memory may be embedded within the host, such as in the form of a solid-state disk (SSD) drive installed in a personal computer.

In some embodiments, memory system 100 includes a single channel between Controller 122 and non-volatile memory die 108, the subject matter described herein is not limited to having a single memory channel. For example, in some memory system architectures, 2, 4, 8 or more channels may exist between the Controller and the memory die, depending on Controller capabilities. In any of the embodiments described herein, more than a single channel may exist between the Controller and the memory die, even if a single channel is shown in the drawings.

As depicted in FIG. 3, Controller 122 includes a front-end module 208 that interfaces with a host, a back-end module 210 that interfaces with the one or more non-volatile memory die 108, and various other modules that perform functions which will now be described in detail.

The components of Controller 122 depicted in FIG. 3 may take the form of a packaged functional hardware unit (e.g., an electrical circuit) designed for use with other components, a portion of a program code (e.g., software or firmware) executable by a (micro)processor or processing circuitry (or one or more processors) that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively, or in addition, each module may include or comprise software stored in a processor readable device (e.g., memory) to program one or more processors for Controller 122 to perform the functions described herein. The architecture depicted in FIG. 3 is one example implementation that may (or may not) use the components of Controller 122 depicted in FIG. 2 (i.e. RAM, ROM, processor, interface).

Referring again to modules of the Controller 122, a buffer manager/bus Controller 214 manages buffers in random access memory (RAM) 216 and controls the internal bus arbitration of Controller 122. A read only memory (ROM) 218 stores system boot code. Although illustrated in FIG. 3 as located separately from the Controller 122, in other embodiments one or both of the RAM 216 and ROM 218 may be located within the Controller. In yet other embodiments, portions of RAM and ROM may be located both within the Controller 122 and outside the Controller. Further, in some implementations, the Controller 122, RAM 216, and ROM 218 may be located on separate semiconductor die.

Front-end module 208 includes a host interface 220 and a physical layer interface 222 (PHY) that provide the electrical interface with the host or next level storage Controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 may be a communication interface that facilitates transfer for data, control signals, and timing signals.

Back-end module 210 includes an error correction Controller (ECC) engine, ECC engine 224, that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. ECC engine 224 and RAID module 228 both calculate redundant data that can be used to recover when errors occur and may be considered examples of redundancy encoders. Together, ECC engine 224 and RAID module 228 may be considered to form a combined redundancy encoder 234. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back-end module 210.

Additional components of memory system 100 illustrated in FIG. 3 include media management layer 238, which performs wear leveling of memory cells of non-volatile memory die 108. Memory system 100 also includes other discrete components 240, such as external electrical interfaces, external RAM, resistors, capacitors, or other components that may interface with Controller 122. In alternative embodiments, one or more of the physical layer interface 222, RAID module 228, media management layer 238 and buffer management/bus Controller 214 are optional components that are not necessary in the Controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the flash memory 126 of memory die 108. The MML 238 may be needed because: 1) the flash memory may have limited endurance; 2) the flash memory 126 may only be written in multiples of pages; and/or 3) the flash memory 126 may not be written unless it is erased as a block (i.e. a block may be considered to be a minimum unit of erase). The MML 238 understands these potential limitations of the flash memory 126 which may not be visible to the host. Accordingly, the MML 238 attempts to translate the writes from host into writes into the flash memory 126.

Controller 122 may interface with one or more memory die 108. In one embodiment, Controller 122 and multiple memory dies (together comprising memory system 100) implement a solid-state drive (SSD), which can emulate, replace or be used instead of a hard disk drive inside a host, as a NAS device, etc. Additionally, the SSD need not be made to work as a hard drive.

Figure 4:
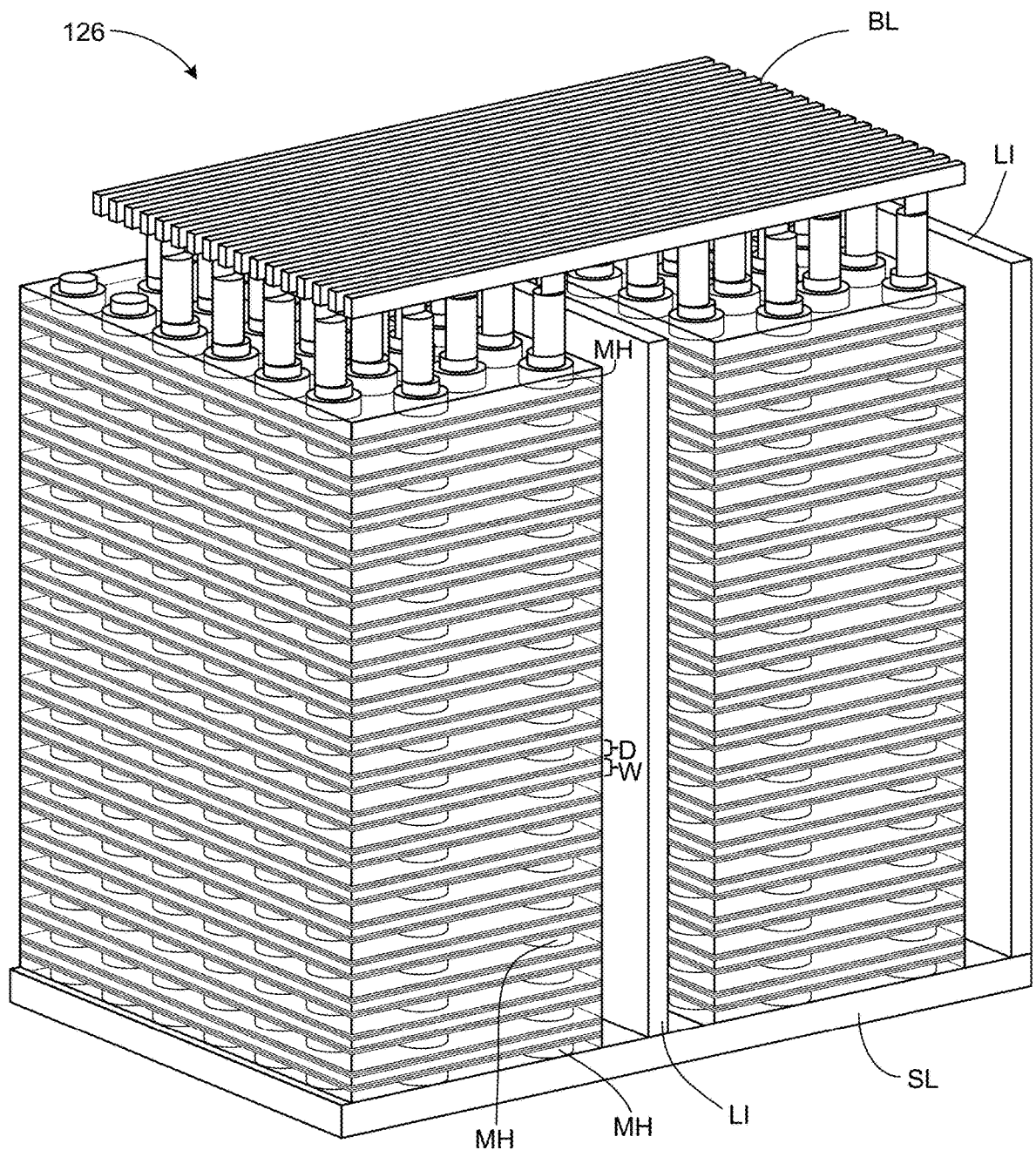
FIG. 4 is a perspective view of a portion of one embodiment of a three-dimensional monolithic memory structure.

FIG. 4 is a perspective view of a portion of a three-dimensional memory structure 126, which includes a plurality memory cells. For example, FIG. 4 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-216 alternating dielectric layers and conductive layers, for example, 96 data word line layers, 8 select layers, 4 dummy word line layers and 108 dielectric layers. More or less than 108-216 layers can also be used. As will be explained below, the alternating dielectric layers and conductive layers are divided into four "fingers" by local interconnects LI. FIG. 4 only shows two fingers and two local interconnects LI. Below and the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data. More details of the three-dimensional memory structure 126 is provided below with respect to FIG. 4A-4F.

Figure 4A:
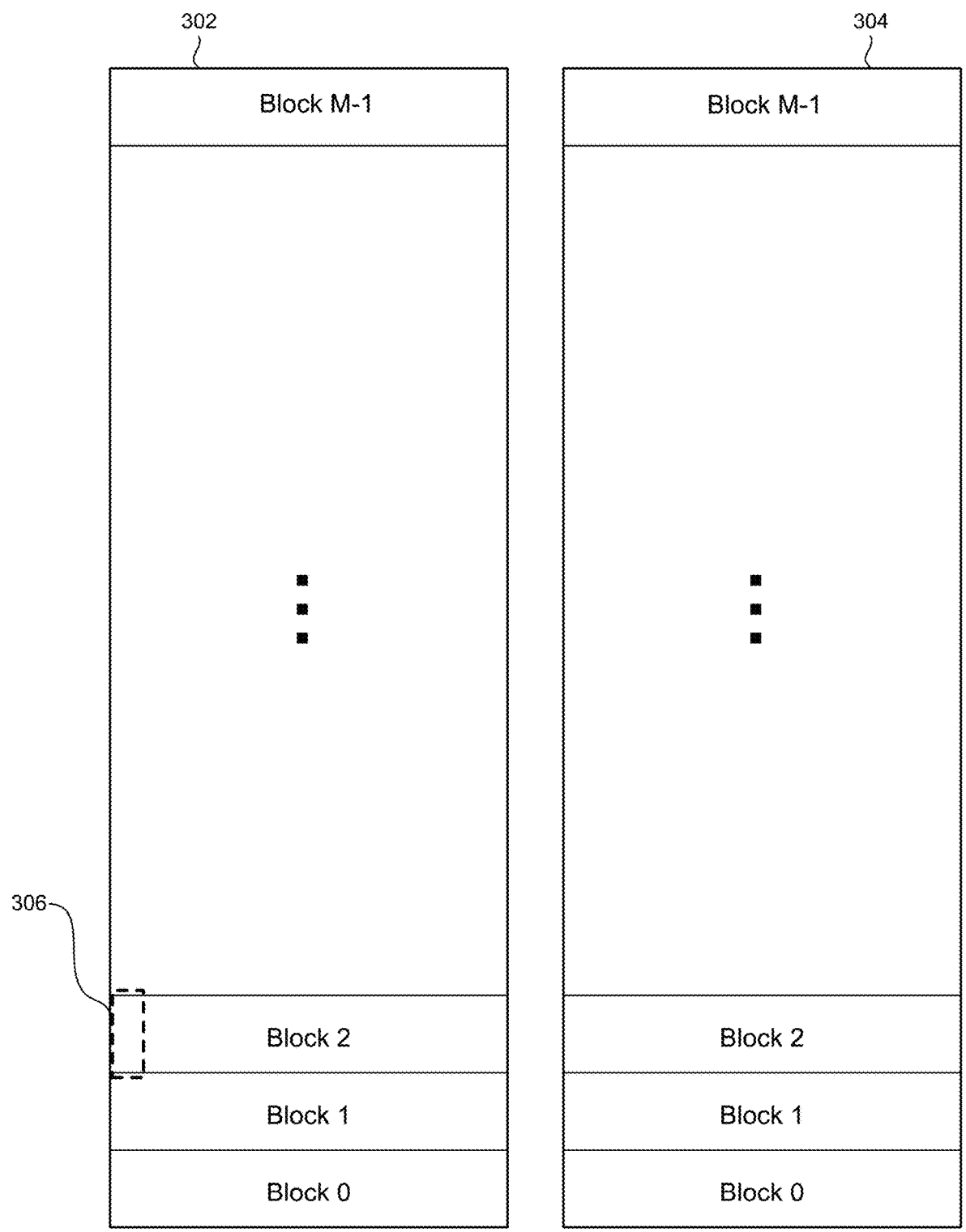
FIG. 4A is a block diagram of a memory structure having two planes.

FIG. 4A is a block diagram explaining one example organization of memory structure 126, which is divided into two planes 302 and 304. Each plane is then divided into M blocks. In one example, each plane has about 2000 blocks. However, different numbers of blocks and planes can also be used. In one embodiment, for two plane memory, the block IDs are usually such that even blocks belong to one plane and odd blocks belong to another plane; therefore, plane 302 includes block 0, 2, 4, 6, . . . and plane 304 includes blocks 1, 3, 5, 7, . . . . In on embodiment, a block of memory cells is a unit of erase. That is, all memory cells of a block are erased together. In other embodiments, memory cells can be grouped into blocks for other reasons, such as to organize the memory structure 126 to enable the signaling and selection circuits.

Figure 4B:
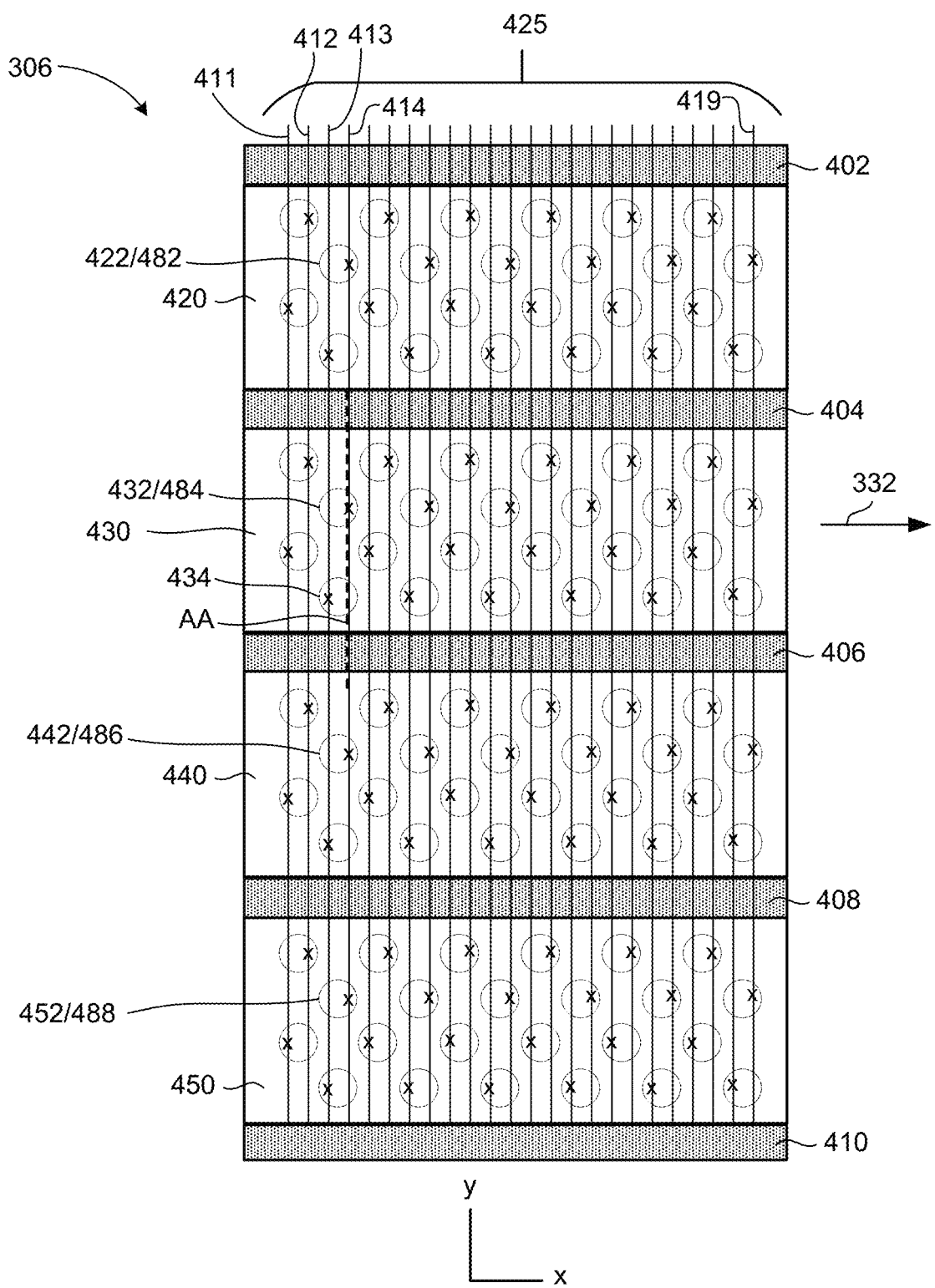
FIG. 4B depicts a top view of a portion of a block of memory cells.

FIGS. 4B-4F depict an example 3D NAND structure. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in the direction of 332. In one embodiment, the memory array will have 60 layers. Other embodiments have less than or more than 60 layers. However, FIG. 4B only shows the top layer.

FIG. 4B depicts a plurality of circles that represent the vertical columns. Each of the vertical columns include multiple select transistors and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 330 and in the direction of arrow 332, the block includes more vertical columns than depicted in FIG. 4B FIG. 4B also depicts a set of bit lines 425, including bit lines 411, 412, 413, 414, . . . 419. FIG. 4B shows twenty-four bit lines because only a portion of the block is depicted. It is contemplated that more than twenty-four bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side select lines and the drain side select lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
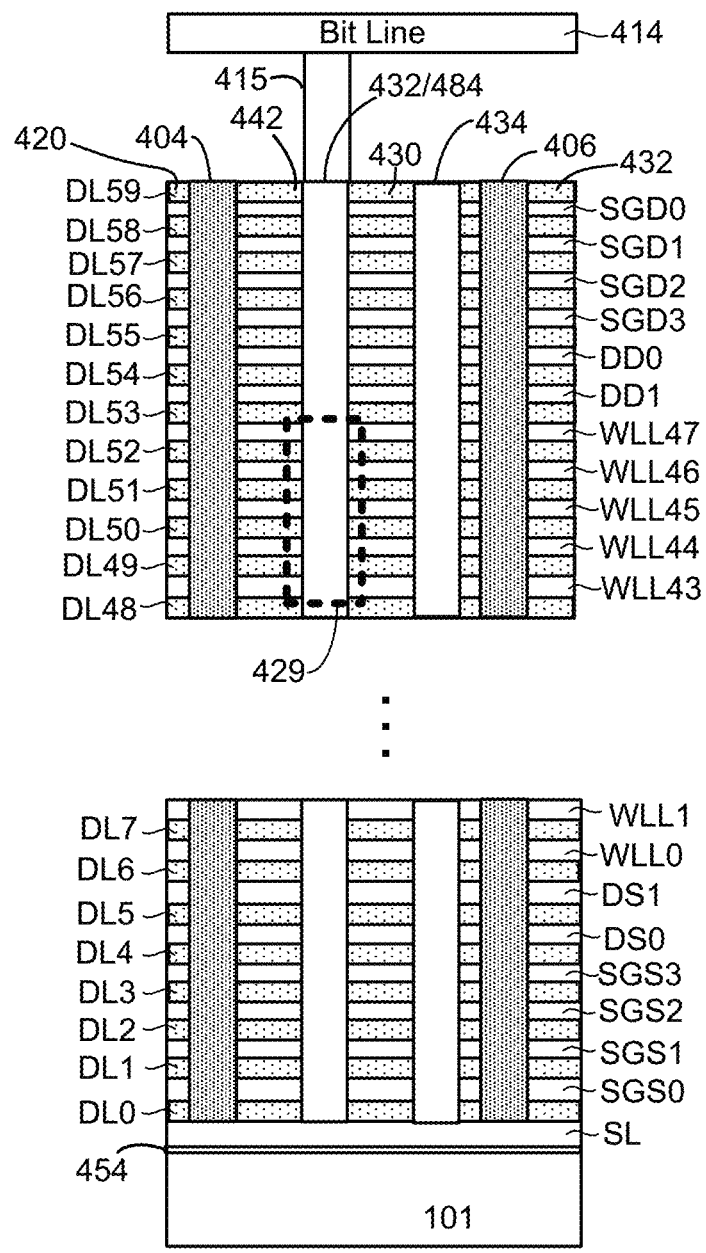
FIG. 4C depicts a cross sectional view of a portion of a block of memory cells.

FIG. 4C depicts a portion of an embodiment of three-dimensional memory structure 126 showing a cross-sectional view along line AA of FIG. 4B. This cross-sectional view cuts through vertical columns 432 and 434 and region 430 (see FIG. 4B). The structure of FIG. 4C includes four drain side select layers SGD0, SGD1, SGD2 and SGD3; four source side select layers SGS0, SGS1, SGS2 and SGS3; four dummy word line layers DD0, DD1, DS0 and DS1; and forty-eight data word line layers WLL0-WLL47 for connecting to data memory cells. Other embodiments can implement more or less than four drain side select layers, more or less than four source side select layers, more or less than four dummy word line layers, and more or less than forty-eight-word line layers (e.g., 96 word line layers). Vertical columns 432 and 434 are depicted protruding through the drain side select layers, source side select layers, dummy word line layers and word line layers. In one embodiment, each vertical column comprises a NAND string. For example, vertical column 432 comprises NAND string 484. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to bit lines 414 via connector 415. Local interconnects 404 and 406 are also depicted.

For ease of reference, drain side select layers SGD0, SGD1, SGD2 and SGD3; source side select layers SGS0, SGS1, SGS2 and SGS3; dummy word line layers DD0, DD1, DS0 and DS1; and word line layers WLL0-WLL47 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL59. For example, dielectric layers DL49 is above word line layer WLL43 and below word line layer WLL44. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layer WLL0-WLL47 connect to memory cells (also called data memory cells). Dummy word line layers DD0, DD1, DS0 and DS1 connect to dummy memory cells. A dummy memory cell does not store user data, while a data memory cell is eligible to store user data. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

Figure 4D:
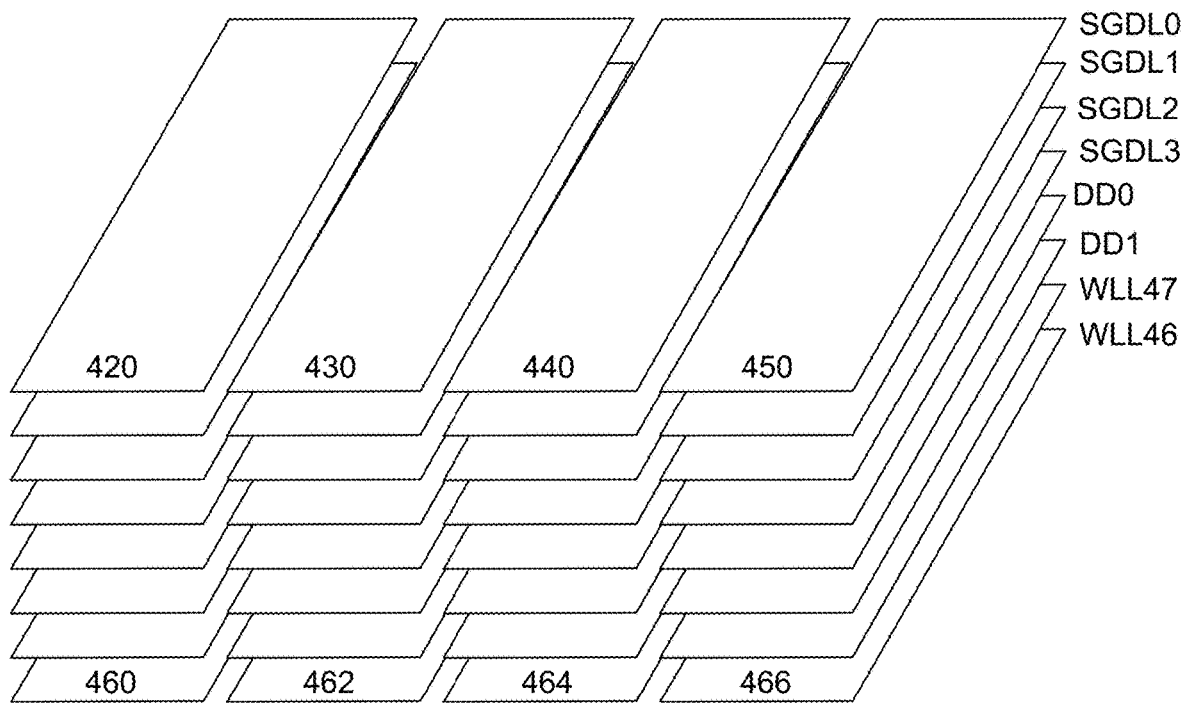
FIG. 4D depicts a view of the select gate layers and word line layers.
Figure 4D:
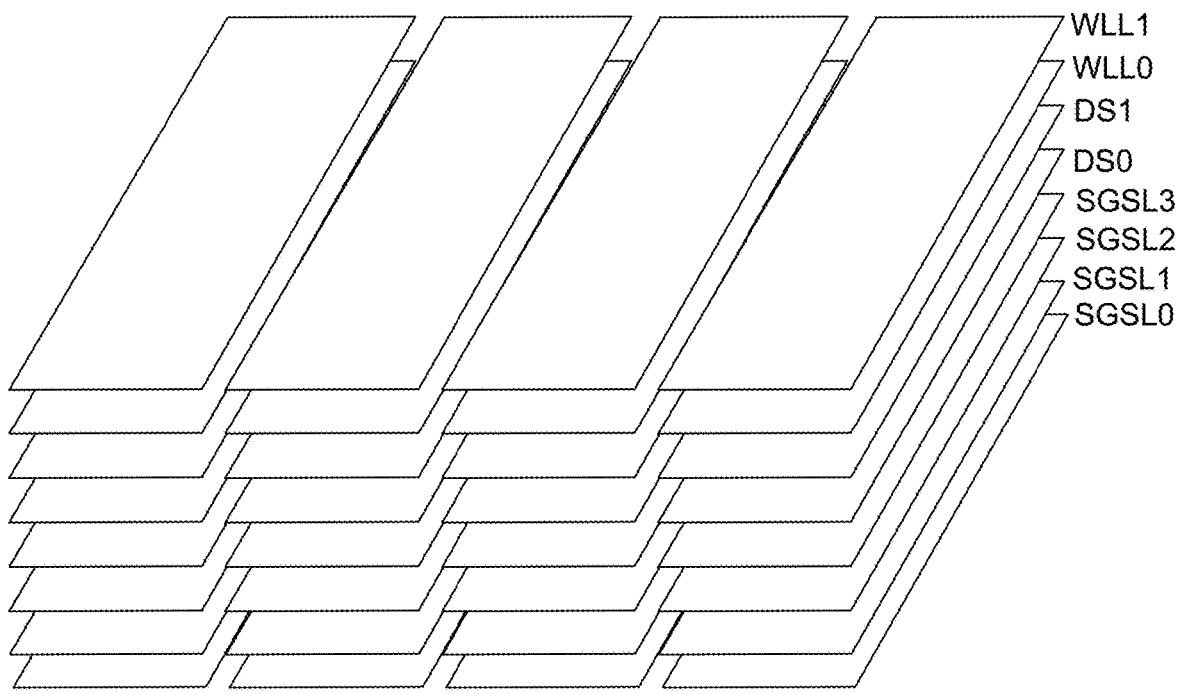

FIG. 4D depicts a logical representation of the conductive layers (SGD0, SGD1, SGD2, SGD3, SGS0, SGS1, SGS2, SGS3, DD0, DD1, DS0, DS1, and WLL0-WLL47) for the block that is partially depicted in FIG. 4C. As mentioned above with respect to FIG. 4B, in one embodiment, local interconnects 402, 404, 406, 408 and 410 break up each conductive layer into four regions or fingers. For example, word line layer WLL31 is divided into regions 460, 462, 464 and 466. For word line layers (WLL0-WLL31), the regions are referred to as word line fingers; for example, word line layer WLL46 is divided into word line fingers 460, 462, 464 and 466. In one embodiment, the four word line fingers on a same level are connected together. In another embodiment, each word line finger operates as a separate word line.

Drain side select gate layer SGD0 (the top layer) is also divided into regions 420, 430, 440 and 450, also known as fingers or select line fingers. In one embodiment, the four select line fingers on a same level are connected together. In another embodiment, each select line finger operates as a separate word line.

FIG. 4E depicts a cross sectional view of region 429 of FIG. 4C that includes a portion of vertical column 432. In one embodiment, the vertical columns are round and include four layers; however, in other embodiments more or less than four layers can be included, and other shapes can be used. In one embodiment, vertical column 432 includes an inner core 470 that is made of a dielectric, such as $SiO_2$. Other materials can also be used. Surrounding inner core 470 is a polysilicon channel, channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 4E depicts dielectric layers DLL49, DLL50, DLL51, DLL52 and DLL53, as well as word line layers WLL43, WLL44, WLL45, WLL46, and WLL47. Each of the word line layers includes a word line region 476 surrounded by an aluminum oxide layer 477, which is surrounded by a blocking oxide layer 478 (SiO2). The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL47 and a portion of vertical column 432 comprise a memory cell MC1. Word line layer WLL46 and a portion of vertical column 432 comprise a memory cell MC2. Word line layer WLL45 and a portion of vertical column 432 comprise a memory cell MC3. Word line layer WLL44 and a portion of vertical column 432 comprise a memory cell MC4. Word line layer WLL43 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming a non-volatile storage system is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 4F:
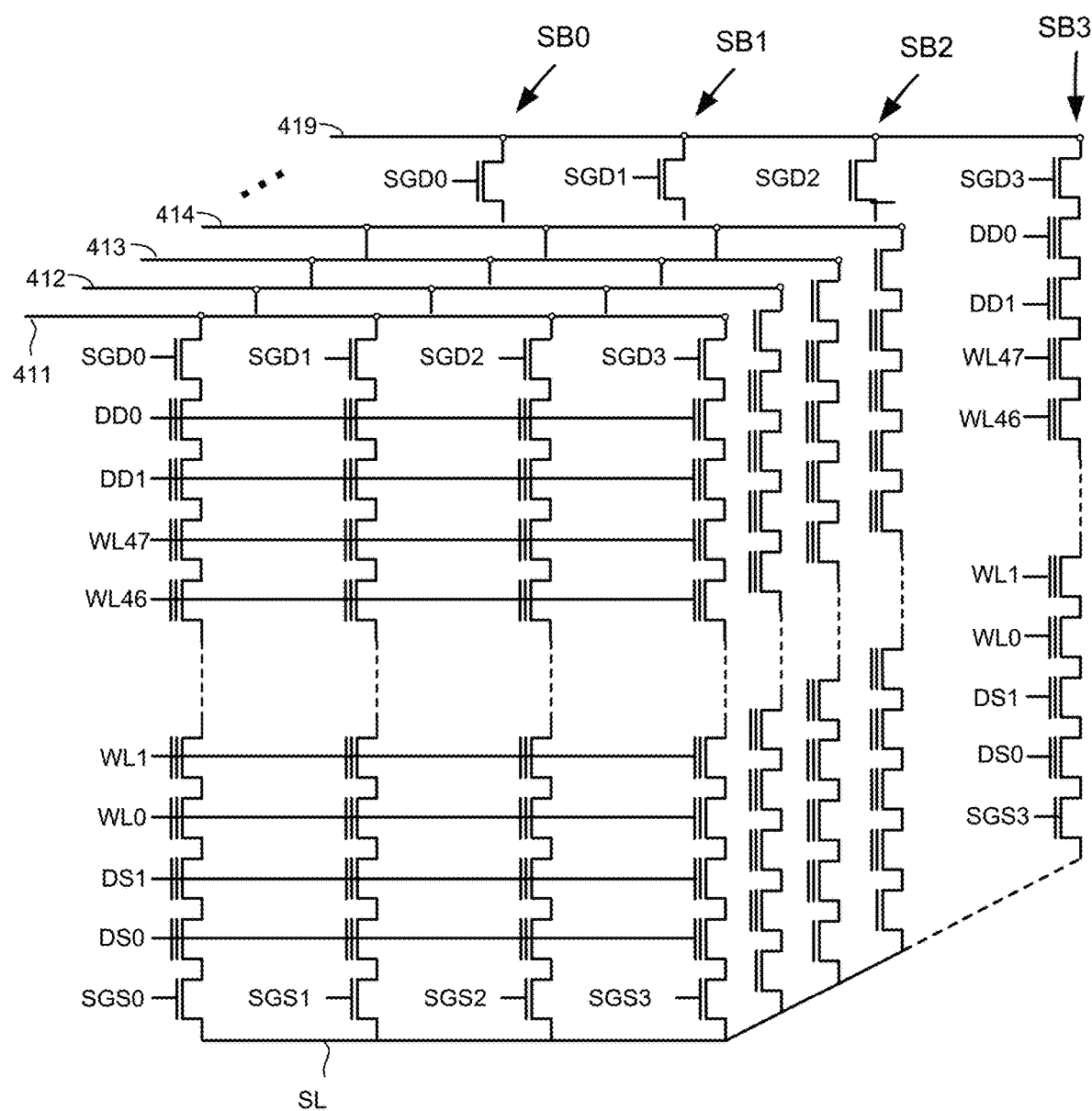
FIG. 4F is a schematic of a plurality of NAND strings.

FIG. 4F shows physical word lines WLL0-WLL47 running across the entire block. The structure of FIG. 4G corresponds to portion 306 in Block 2 of FIGS. 4A-F, including bit lines 411, 412, 413, 414, . . . 419. Within the block, each bit line connected to four NAND strings. Drain side select lines SGD0, SGD1, SGD2 and SGD3 are used to determine which of the four NAND strings connect to the associated bit line. The block can also be thought of as divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Although the example memory system of FIGS. 4-4F is a three-dimensional memory structure that includes vertical NAND strings with charge-trapping material, other (2D and 3D) memory structures can also be used with the technology described herein. For example, floating gate memories (e.g., NAND-type and NOR-type flash memory ReRAM memories, magnetoresistive memory (e.g., MRAM), and phase change memory (e.g., PCRAM) can also be used.

One example of a ReRAM memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. This configuration is known as a spin valve and is the simplest structure for an MRAM bit. A memory device is built from a grid of such memory cells. In one embodiment for programming a non-volatile storage system, each memory cell lies between a pair of write lines arranged at right angles to each other, parallel to the cell, one above and one below the cell. When current is passed through them, an induced magnetic field is created.

Phase change memory (PCM, e.g. PCRAM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

Figure 5:
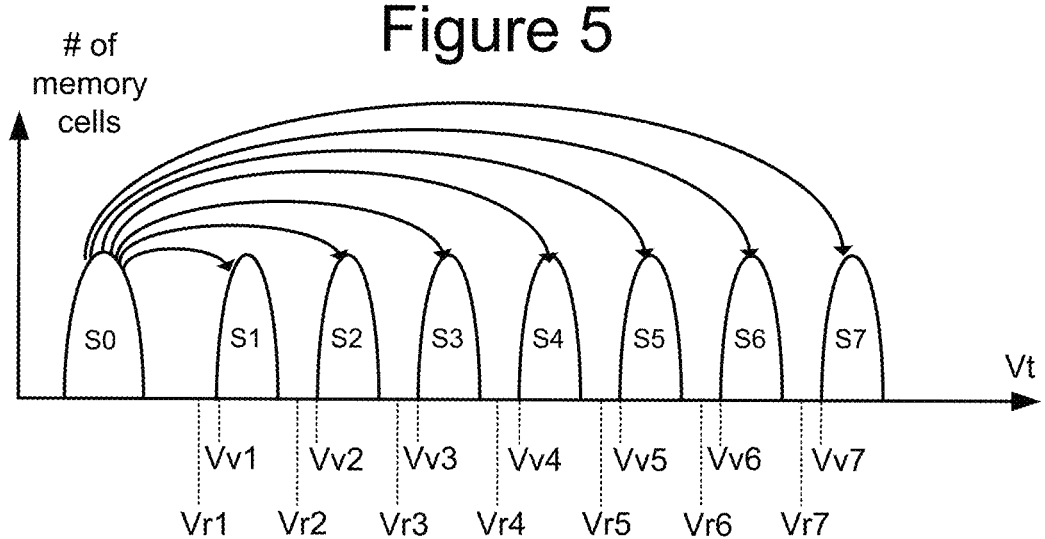
FIG. 5 depicts threshold voltage distributions.

At the end of a successful programming process (with verification), the threshold voltages of the memory cells should be within one or more distributions of threshold voltages for programmed memory cells or within a distribution of threshold voltages for erased memory cells, as appropriate. FIG. 5 illustrates example threshold voltage distributions for the memory cell array when each memory cell stores three bits of data. Other embodiments, however, may use other data capacities per memory cell (e.g., such as one, two, four, or five bits of data per memory cell). FIG. 5 shows eight threshold voltage distributions, corresponding to eight data states. The first threshold voltage distribution (data state) S0 represents memory cells that are erased. The other seven threshold voltage distributions (data states) S1-S17 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 5 also shows seven read reference voltages, Vr1, Vr2, Vr3, Vr4, Vr5, Vr6, and Vr7, for reading data from memory cells. By testing whether the threshold voltage of a given memory cell is above or below the seven read reference voltages, the system can determine what data state (i.e., S0, S1, S2, S3, . . . ) the memory cell is in.

FIG. 5 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv4. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 5 represent the full sequence programming. The technology described herein can also be used with other types of programming in addition to full sequence programming (including, but not limited to, multiple stage/phase programming). In some embodiments, data states S1-D7 can overlap, with Controller 122 relying on ECC to identify the correct data being stored.

Sometimes, when data is read from non-volatile memory cells, one or more bits may be encountered. For example, a cell that was programmed to data state S5 and was verified as having a threshold voltage between Vv5 and Vv6, may subsequently be read as having lower threshold voltage between Vr4 and Vr5 that causes it to be read as being in state S4. Threshold voltages may also appear higher than originally programmed threshold voltages. A memory cell initially programmed to data state S5 and verified as having a threshold voltage between Vv5 and Vv6 may subsequently be read as having a threshold voltage between Vr6 and Vr7 that causes it to be read as being in data state S6. Such changes in threshold voltages may occur because of charge leakage over time, effects of programming or reading, or some other reason. The result may be one or more bad bits (flipped bits) in a portion of data that is read from a set of cells (i.e. a logic 1 may be flipped to a logic 0, or a logic 0 may be flipped to a logic 1).

Because errors can occur when programming, reading, or storing data (e.g., due to electrons drifting, data retention issues or other phenomena) memory systems often use Error Correction Codes (ECC) to protect data from corruption. Many ECC coding schemes are well known in the art. These error correction codes are especially useful in large scale memories, including flash (and other non-volatile) memories, because of the substantial impact on manufacturing yield and device reliability that such coding schemes can provide, rendering devices that have a few non-programmable or defective cells as useable. Of course, a tradeoff exists between the yield savings and the cost of providing additional memory cells to store the code bits (i.e., the code "rate"). As such, some ECC codes are better suited for flash memory devices than others. Generally, ECC codes for flash memory devices tend to have higher code rates (i.e., a lower ratio of code bits to data bits) than the codes used in data communications applications (which may have code rates as low as ½). Examples of well-known ECC codes commonly used in connection with flash memory storage include Reed-Solomon codes, other BCH codes, Hamming codes, and the like. Sometimes, the error correction codes used in connection with flash memory storage are "systematic," in that the data portion of the eventual code word is unchanged from the actual data being encoded, with the code or parity bits appended to the data bits to form the complete code word. In other cases, the data being encoded is transformed during encoding.

The particular parameters for a given error correction code include the type of code, the size of the block of actual data from which the code word is derived, and the overall length of the code word after encoding. For example, a typical BCH code applied to a sector of 512 bytes (4096 bits) of data can correct up to four error bits, if at least 60 ECC or parity bits are used. Reed-Solomon codes are a subset of BCH codes and are also commonly used for error correction. For example, a typical Reed-Solomon code can correct up to four errors in a 512-byte sector of data, using about 72 ECC bits. In the flash memory context, error correction coding provides substantial improvement in manufacturing yield, as well as in the reliability of the flash memory over time.

In some embodiments, a controller, such as Controller 122, receives host data, also referred to as information bits, that is to be stored memory structure 126. The informational bits are represented by the matrix i=[1 0] (note that two bits are used for example purposes only, and many embodiments have code words longer than two bits). An error correction coding process (such as any of the processes mentioned above or below) is implemented in which parity bits are added to the informational bits to provide data represented by the matrix or code word v=[1 0 1 0], indicating that two parity bits have been appended to the data bits. Other techniques can be used that map input data to output data in more complex manners. For example, low density parity check (LDPC) codes, also referred to as Gallager codes, can be used. More details about LDPC codes can be found in R. G. Gallager, "Low-density parity-check codes," IRE Trans. Inform. Theory, vol. IT-8, pp. 21 28, January 1962; and D. MacKay, Information Theory, Inference and Learning Algorithms, Cambridge University Press 2003, chapter 47. In practice, such LDPC codes may be applied to multiple pages encoded across a number of storage elements, but they do not need to be applied across multiple pages. The data bits can be mapped to a logical page and stored in the memory structure 126 by programming one or more memory cells to one or more programming states, which corresponds to v.

In one possible implementation, an iterative probabilistic decoding process is used when reading data which implements error correction decoding corresponding to the encoding implemented in the Controller 122 (see ECC engine 224). Further details regarding iterative probabilistic decoding can be found in the above-mentioned D. MacKay text. The iterative probabilistic decoding attempts to decode a code word read from the memory by assigning initial probability metrics to each bit in the code word. The probability metrics indicate a reliability of each bit, that is, how likely it is that the bit is not in error. In one approach, the probability metrics are logarithmic likelihood ratios LLRs which are obtained from LLR tables. LLR values are measures of the reliability with which the values of various binary bits read from the storage elements are known.

The LLR for a bit is given by $$Q = \log_2 \frac{P(v=0|Y)}{P(v=1|Y)},$$

where P(v=0|Y) is the probability that a bit is a 0 given the condition that the state read is Y, and P(v=1|Y) is the probability that a bit is a 1 given the condition that the state read is Y. Thus, an LLR>0 indicates a bit is more likely a 0 than a 1, while an LLR<0 indicates a bit is more likely a 1 than a 0, to meet one or more parity checks of the error correction code. Further, a greater magnitude indicates a greater probability or reliability. Thus, a bit with an LLR=63 is more likely to be a 0 than a bit with an LLR=5, and a bit with an LLR=−63 is more likely to be a 1 than a bit with an LLR=−5. LLR=0 indicates the bit is equally likely to be a 0 or a 1.

An LLR value can be provided for each of the bit positions in a code word. Further, the LLR tables can account for the multiple read results so that an LLR of greater magnitude is used when the bit value is consistent in the different code words.

A controller receives the code word Y1 and accesses the LLRs and iterates in successive iterations in which it determines if parity checks of the error encoding process have been satisfied. If all parity checks have been satisfied, the decoding process has converged, and the code word has been successfully error corrected. If one or more parity checks have not been satisfied, the decoder will adjust the LLRs of one or more of the bits which are inconsistent with a parity check and then reapply the parity check or next check in the process to determine if it has been satisfied. For example, the magnitude and/or polarity of the LLRs can be adjusted. If the parity check in question is still not satisfied, the LLR can be adjusted again in another iteration. Adjusting the LLRs can result in flipping a bit (e.g., from 0 to 1 or from 1 to 0) in some, but not all, cases. In one embodiment, another parity check is applied to the code word, if applicable, once the parity check in question has been satisfied. In others, the process moves to the next parity check, looping back to the failed check at a later time. The process continues in an attempt to satisfy all parity checks. Thus, the decoding process of Y1 is completed to obtain the decoded information including parity bits v and the decoded information bits i.

Redundancy may be provided by using a RAID type arrangement as an additional level of integrity protection for the data being written into a non-volatile memory system. In some cases, the RAID module may be a part of an ECC engine, or may be combined with an ECC engine, or ECC engines, to form a combined redundancy encoder, that encodes received data to provide encoded data with a combined code rate (i.e. the overall code rate may be based on the redundant bits added by ECC and RAID). Note that the RAID parity may be added as an extra die or dies, within a single die, e.g. as an extra plane, or extra block, or extra WLs within a block or in some other way.

Figure 6:
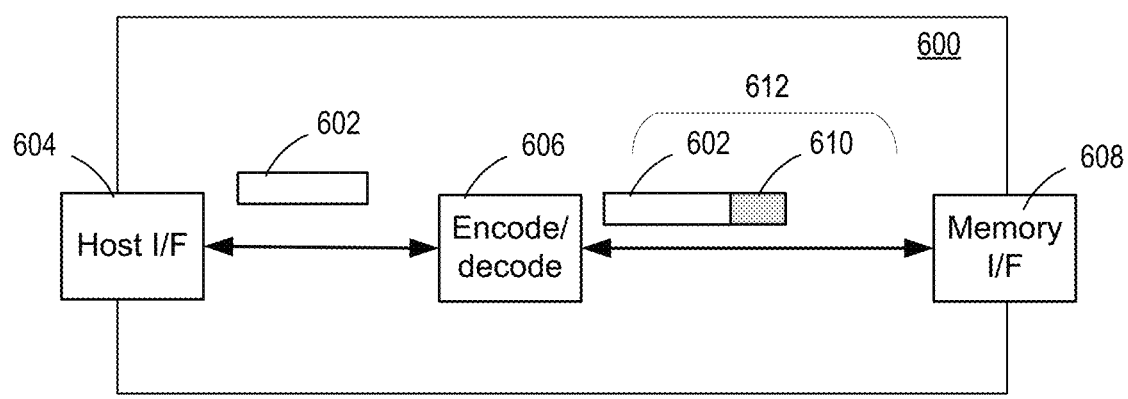
FIG. 6 illustrates control circuits including an ECC encoder/decoder.

FIG. 6 illustrates an example of an encoder/decoder operating in a control circuit 600 in a non-volatile memory system (e.g. in a memory system as described in any example above). Encoder 606 (the term "encoder" is used for simplicity although encoder 606 may also decode encoded data) is in communication with a host interface 604 and a memory interface 608. Encoder 606 receives a portion of data 602 from host interface 604 (e.g. a portion of data received from a host). Encoder 606 then performs redundancy calculations to generate redundant bits 610 which are appended to data 602 in this example to form encoded data 612. In other examples, data is transformed so that the original data bits are not provided in the encoded data. Encoder 606 may use BCH, LDPC, or any other encoding scheme to. Encoded data 612 is sent to memory interface 608 and may be stored in a non-volatile memory (such as a 3D memory array as described above). Thus, redundant bits 610 are stored in non-volatile memory so that the total number of bits stored is greater than the number of bits received by control circuit 600. When data is read, this encoding process is reversed. Data 612, including redundant bits 610 is read and provided by memory interface 608 to encoder 606. Encoder 606 uses redundant bits 610 to identify and correct bad bits in data 612 (up to some limit). A corrected version of data 602 is then sent to host interface 604, where it may be sent to a host. The steps of encoding and decoding may not be visible to the host.

In some cases, in addition to detecting and correcting bad bits before sending data to a host, ECC, RAID, or other error detection systems may be used to monitor numbers of bad bits that occur in a non-volatile memory system. For example, the number of bad bits in a portion of data, or the Failure Bit Count (FBC), may be monitored for data stored in a set of cells such as a particular word line, physical layer, bit line, block, plane, die, or other unit. Collecting data for different units in a non-volatile memory array may provide useful information for making memory management decisions. For example, bad blocks may be identified, or blocks or other units that require modified operating parameters may be identified.

Figure 7:
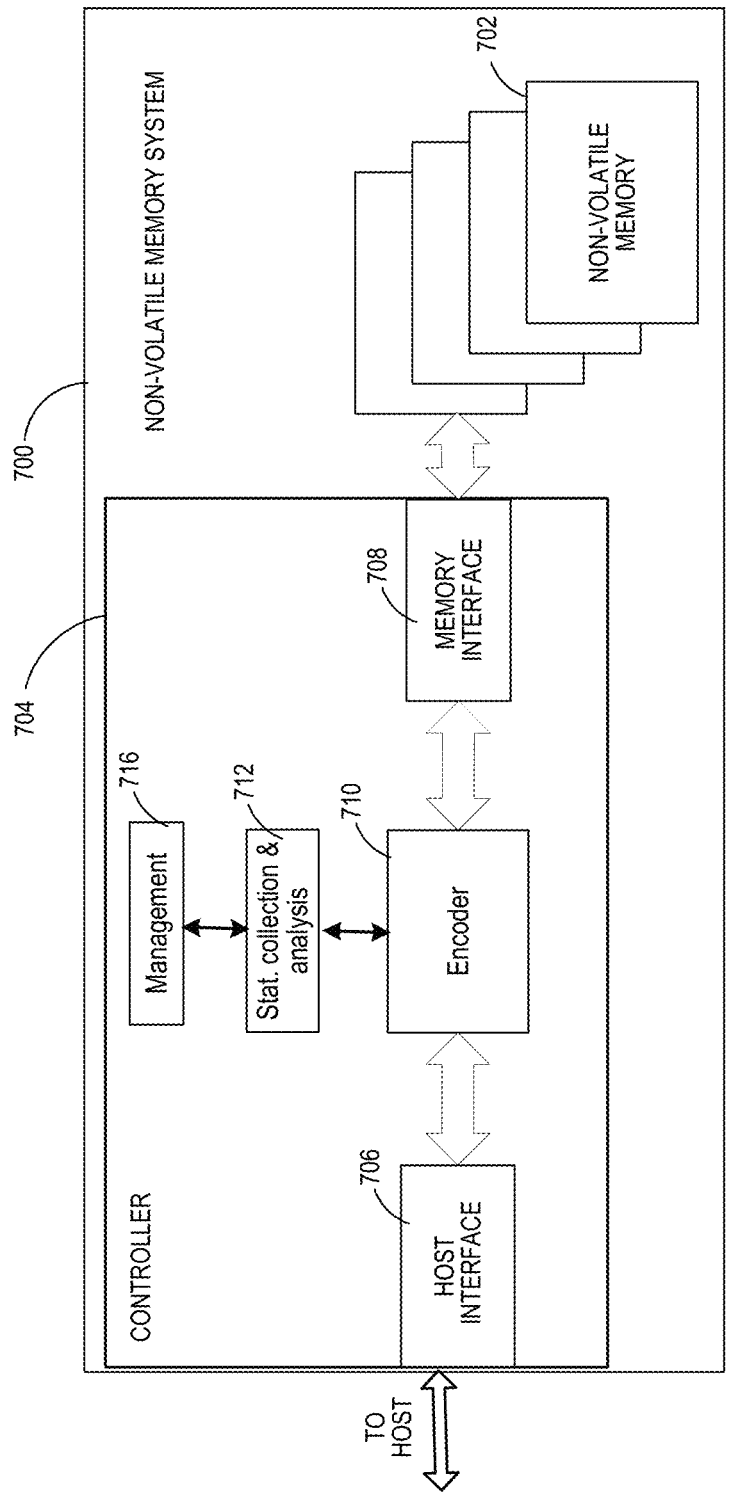
FIG. 7 illustrates a non-volatile memory system.

FIG. 7 shows an example of a non-volatile memory system 700 that includes a non-volatile memory 702 (e.g. having multiple dies, each formed of multiple blocks, each block formed of multiple word lines) and a memory controller 704. Memory controller 704 includes encoder 710 interposed between host interface 706 and memory interface 708 to encode data prior to storage in non-volatile memory 702 and to decode data read from non-volatile memory 702 (e.g. as described above with respect to FIG. 6). A statistical collection and analysis unit 712 is in communication with encoder 710 to collect FBC data from encoder 710 (e.g. recording FBCs in a table or other structure). For example, statistical collection and analysis unit 712 may record FBC numbers for various physical units in non-volatile memory 702 and these FBC numbers may be statistically analyzed to obtain generalized information regarding non-volatile memory 702, or units within non-volatile memory 702. Statistical collection and analysis unit 712 may include a storage area to store data or may send data for storage elsewhere, e.g. to a memory in memory controller 704 or to non-volatile memory 702. For example, statistical collection and analysis unit 712 may receive FBC numbers when data from different blocks is decoded by encoder 710 and may record FBC numbers on a block-by-block basis. Thus, statistical collection and analysis unit 712 may be considered a means for collecting FBCs for data read from non-volatile memory cells. The stored data is analyzed to estimate probability of events such as occurrence of a target FBC, which may be useful in a number of ways. Such estimated probabilities may be tracked for units such as word lines, blocks, planes, dies etc. Statistical collection and analysis unit 712 is in communication with memory management circuits 716, which may include circuits to implement various memory management operations in non-volatile memory 702, e.g. wear leveling, garbage collection, and bad block identification, so that such operations may be implemented according to probabilities generated by statistical collection and analysis unit 712.

With a large enough number of samples, statistical analysis may be used to predict events that have very low probability. For example, a particular FBC that has a very low probability (e.g. $10^{-9}$) may be predicted based on a large number of samples (e.g. of the order of $10^9$). Collecting, storing, and analyzing such large sample sizes may be performed in a test environment using external testing and analysis equipment over an extended period of time. However, such testing is costly (significant equipment cost) and time consuming (significant time to collect large sample populations). Furthermore, analysis of such large sample populations may require significant computing power.

An alternative to gathering a large number of samples is to use a model to extrapolate from a relatively small number of samples to predict events that have a low probability. This may allow relatively rare events to be predicted based on a small number of samples so that testing time and resources may be reduced, thereby reducing time to market. Such testing may be performed by external test equipment so that a controller like controller 704 in a test unit would include a statistical collection and analysis unit to collect FBC data from one or more memory dies. In some cases, collection and analysis of FBC data using a relatively small number of samples (e.g. a number of FBCs that is less than 1000) may be performed by control circuits in a non-volatile memory system (as shown in FIG. 7) without external test and analysis equipment, so that analysis can be performed in real-time during memory use to reflect changing FBC data. Analysis may provide accurate predictive information of even low-probability events and may allow corrective action to be taken to mitigate any potential impact (i.e. memory management may be informed by statistical analysis and may make better memory management decisions as a result).

The risk of a unit having a given failure rate (i.e. the risk of a given FBC) is commonly expressed in terms of the Cumulative Distributed Function (CDF) of FBCs in a unit. For example, the complementary CDF (1-CDF) of a set of FBC samples may be used to indicate the probability of occurrence of an FBC above a particular FBC. A requirement for a non-volatile memory system may be that the probability of a block having an FBC greater than 500 is less than $10^{-7}$, or some similar requirement that is stated in terms of a low probability of a relatively high FBC which may correspond to block failure (e.g. point at which data is uncorrectable by ECC, or requires unacceptable time and/or ECC resources). Complementary CDF (CCDF) is a well-known function used in reliability, which is given by equation 1:

$$1 - CDF(x \mid \mu, \sigma^2) = \frac{1}{2} - \frac{1}{2}\mathrm{erf}\left(\frac{x-\mu}{\sqrt{2}\,\sigma}\right)$$
$$= \frac{1}{\sqrt{\pi}} \int_{\frac{x-\mu}{\sqrt{2}\sigma}}^{\infty} e^{-t^2}\, dt$$

Equation 1

Where "erf" is the Error function, $\mu$ is the mean, and $\sigma$ is the variance. In general, the Error function is a special function that cannot be expressed in terms of elementary mathematical functions so that it is difficult to approximate 1-CDF in a simple way.

It has been found that a CCDF function may be approximated by an analytic function such as a Fermi-Dirac type distribution (used to describe energy states of fermions) represented by equation 2:

$$FD = \frac{1}{e^{\frac{x-E}{K}} + 1}$$

Equation 2

Where E is the average value, K is proportional to the standard deviation (i.e. equal to the standard deviation multiplied by a constant) and x is the value of interest (e.g. FBC threshold). This distribution may be easily generated from easily-obtained metrics (mean and standard deviation in this example, median and variance or other metrics may be used in other examples) and may be used to extrapolate from a relatively small sample size to estimate 1-CDF for small probability events.

Figure 8:
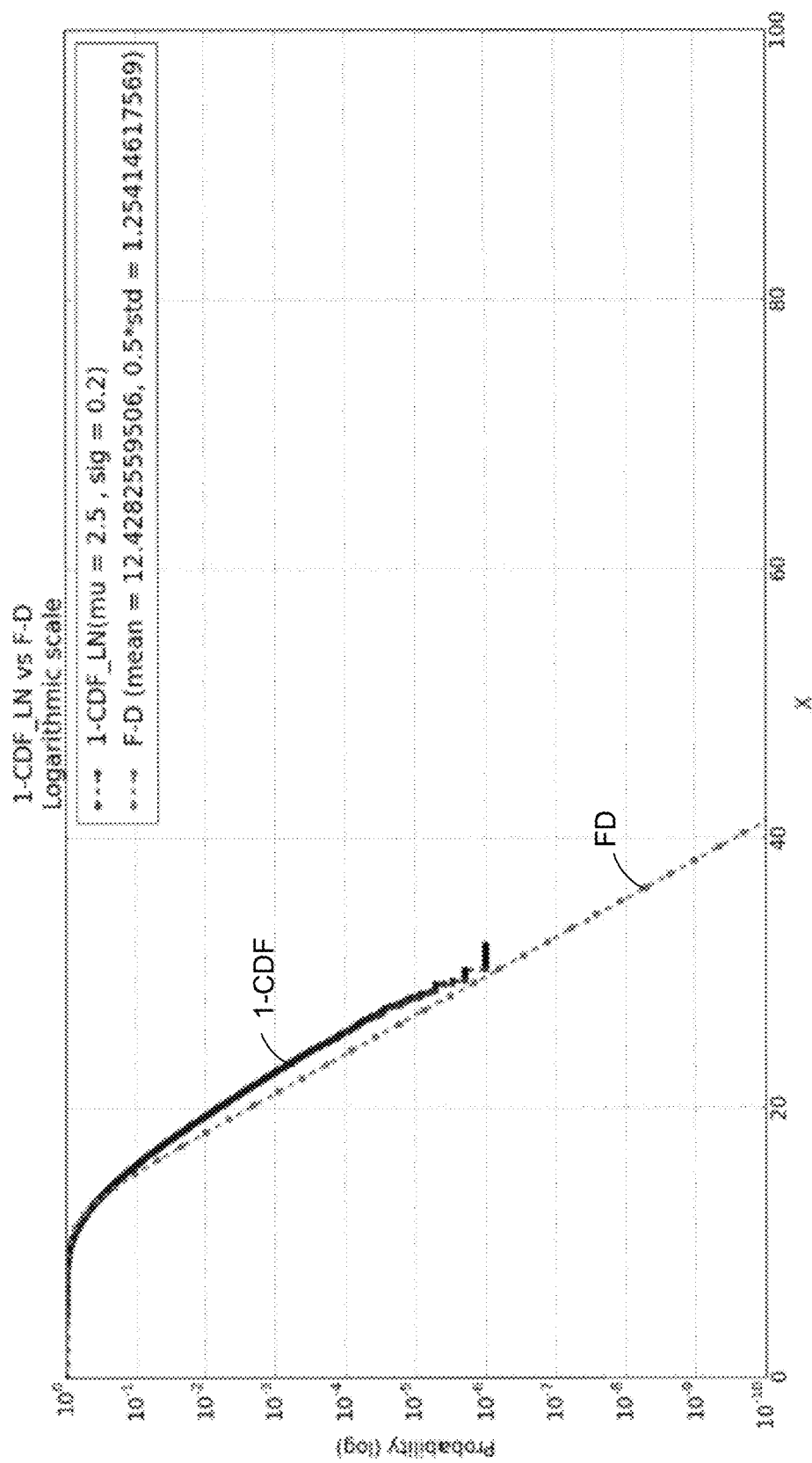
FIG. 8 illustrates correlation of 1-CDF data and FD distribution.

FIG. 8 shows an example of a plot of 1-CDF for FBC data from non-volatile memory testing on a logarithmic scale, with 1-CDF probability shown on the y-axis (logarithmic) and FBC shown on the x-axis. Also shown in FIG. 8 is a FD distribution to approximate the 1-CDF distribution. It can be seen that the FD distribution is a good fit to the 1-CDF distribution generated from FBC data over the range of the 1-CDF distribution for which data was obtained and that the FD distribution provides a model that extends beyond the 1-CDF data (to a probability of $10^{-10}$). While the plot of FIG. 8 is based on a relatively large sample population, with data points down to a probability of $10^{-4}$, to show goodness of fit over a relatively large range, it will be understood that a much smaller sample size may be used to generate an FD distribution and that the large sample size here is for illustration. For example, the parameters E and K obtained from FBC sample sets of about 100 samples have been found to provide FD distributions that approximate a 1-CDF distribution down to a probability of the order of $10^{-7}$. For a small set of data (FBC_set) an accurate approximation is provided by E=Mean ([FBC_set]), K=A*STD([FBC_set]), where A may be a suitable constant value to fit the data according to various factors including FBC set size, FBC distribution, temperature, etc. (e.g. about 0.5, e.g. in a range between 0.3 and 0.7).

A plot such as shown in FIG. 8 may be used to provide various predictive values related to FBCs. For example, for a given FBC value, FBC_val, the evaluated probability of FBC exceeding FBC_val, Prob_Eval, for a given set of FBC samples, FBC_set, is given by equation 3:

$$\mathrm{Prob\_Eval} = \frac{1}{e^{\frac{FBC\_Val - \mathrm{MEAN}[FBC_{set}]}{0.5 \cdot \mathrm{STD}[FBC_{set}]}} + 1}$$

Equation 4

Alternatively, given a probability, Prob, it is possible to estimate the FBC value, FBC_Eval, that has an expected probability=Prob for the set, FBC_set according to equation 5:

$$\mathrm{FBC\_Eval} = 0.5 \cdot \mathrm{STD}[FBC_{set}] \cdot \left(\mathrm{Log}\left(\frac{1}{Prob} - 1\right)\right) + \mathrm{MEAN}[FBC_{set}]$$

Equation 5

In testing the accuracy of modeling using an FD distribution, it has been found that relatively small sample size can provide a good fit. For example, the following table shows measured errors at probability of $10^{-5}$ for three different data sets using three different sample sizes:

| Samples | Data set #1 Error [%] | Data set #2 Error [%] | Data set #3 Error [%] |
|---|---|---|---|
| 10 | ~10% | ~30% | ~10% |
| 50 | ~10% | ~5% | ~5% |
| 10,000 | ~5% | ~10% | ~5% |

Equation 2 above may be rewritten in simplified form, using an indicator z, as Equation 6:

$$FD(x; E, K) = FD(z) = \frac{1}{e^z + 1}$$

Where $z = \frac{x - E}{K}$

Equation 6

In general, z is a value or indicator that may have a practical range from about −50 to 50 in a non-volatile memory system. For a particular non-volatile memory system, a range of z may be chosen and divided into ranges or bins, with corresponding ranges for $$\frac{1}{e^z + 1}$$

(and FD). Thus, a table may be generated that links z and FD (which approximates 1-CDF). Such a table may be generated and stored in a memory system prior to customer use (e.g. a table may be generated during product development and may be incorporated into firmware for a non-volatile memory system). Subsequently this table may be used to obtain probability for a particular FBC target based on FBC samples collected during memory operation.

Figures 9, 10:
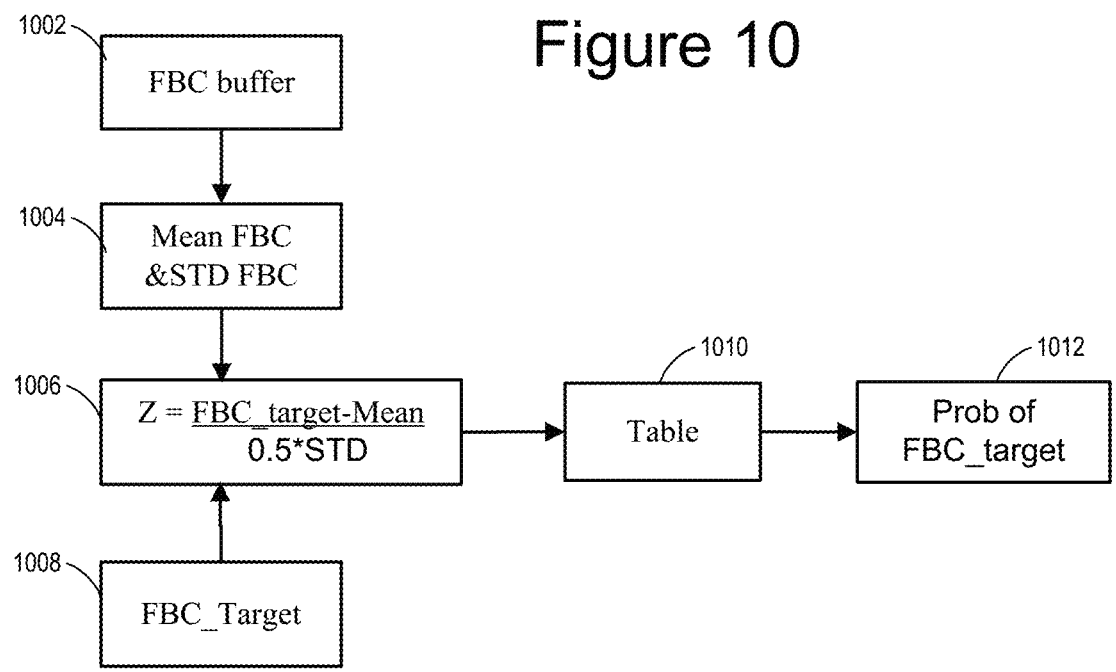
FIG. 9 is an example of a table used to obtain probability of a target FBC.
FIG. 10 illustrates obtaining target FBC probability.

FIG. 9 illustrates an example of a table that links a plurality of indicator values (z values, in the left column) with a plurality of probabilities 1-CDF $$\left(\text{i.e. } \frac{1}{e^z + 1}\right)$$

in the right column. Such a table may be used by a memory controller, for example by statistical collection and analysis unit 712 of controller 704. A z value may be used to lookup the corresponding probability value (i.e. for a given z value, find the closest z value in the left column of the table and read the corresponding probability on the same line in the right column). Thus, probability values in the right column are approximations representing bands of probability. The number of lines in such a table, and hence the granularity of the approximation, may be selected according to needs and according to the accuracy achievable.

FIG. 10 illustrates how a memory controller, such as memory controller 704, may use a table such as shown in FIG. 9 to estimate the probability of a target FBC, FBC_target. FBC data for a non-volatile memory is collected and stored in an FBC buffer 1002 (e.g. a buffer in a memory controller such as memory controller 704, or a buffer maintained in a non-volatile memory). The buffered FBC data is analyzed to obtain metrics such as the mean ("Mean") and standard deviation ("STD") of a 1-CDF distribution of the FBC data 1004 according to well-known techniques. For example, statistical collection and analysis unit 712 may calculate the mean and standard deviation and thus may be considered a means for obtaining the mean and standard deviation of a cumulative distribution function of the FBC data. From the mean and standard deviation, the value of indicator z is calculated according to the equation:

$$Z = \frac{FBC\_target - Mean}{0.5 * STD} 1006,$$

where 0.5 was found to be a value for A that provides a good fit. This may be done in a controller, for example, in statistical collection and analysis unit 712, which may be considered a means for calculating the indicator from the mean and standard deviation of the cumulative distribution of the FBCs and the target FBC. The FBC target value 1008 may be provided by a host, user, or as part of a routine in controller firmware. The value of z calculated is then used to lookup a table 1010 that links indicator values and probability values calculated from an FD model as described above. Such a table (e.g. table of FIG. 9) may be considered a means for obtaining a probability for the target FBC from the indicator. This provides a probability of FBC_target. Thus, for example, if z is found to have a value of 10, looking at the table of FIG. 9 would give a probability of 4.54E-5 for this FBC, which might be unacceptably high in some cases and could lead to some action.

Figure 11:
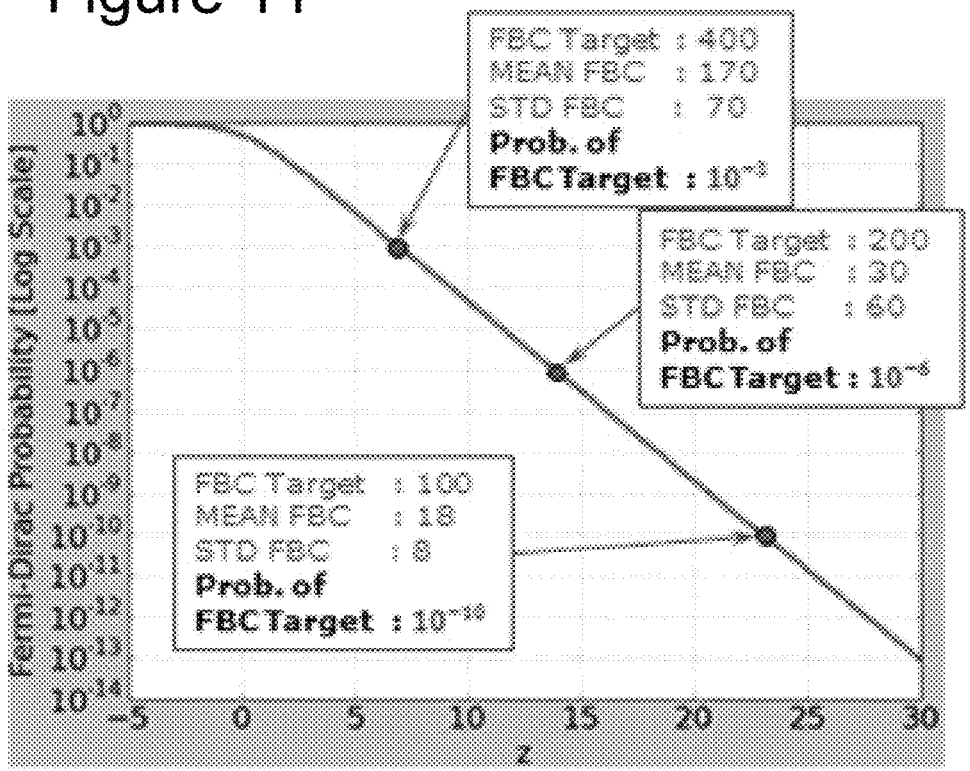
FIG. 11 shows examples of FBC probabilities.

A table such as shown in FIG. 9 may approximate a FD distribution in a general manner, which can be applied to various units with different FBC distributions, and thus can be used to obtain probability for various units in a non-volatile memory for which FBC data is collected (e.g. different word lines, blocks, or dies, or other units). FIG. 11 shows a graphical representation of the relationship between the value of indicator z (on x-axis) and the FD probability (on the y-axis, logarithmic scale), which can be approximated by a table such as shown in FIG. 9 for use in a memory controller such as memory controller 704.

In a first example, an FBC_target=400, Mean=170, and STD=70 to give z=6.57. It can be seen from FIG. 11 that this gives a probability of approximately $10^{-3}$. In a second example, an FBC_target=200, Mean=30, and STD=60 to give z=5.6. It can be seen from FIG. 11 that this gives a probability of approximately $10^{-6}$. In a third example, an FBC_target=100, Mean=18, and STD=8 to give z=20.5. It can be seen from FIG. 11 that this gives a probability of approximately $10^{-10}$.

Figure 12A:
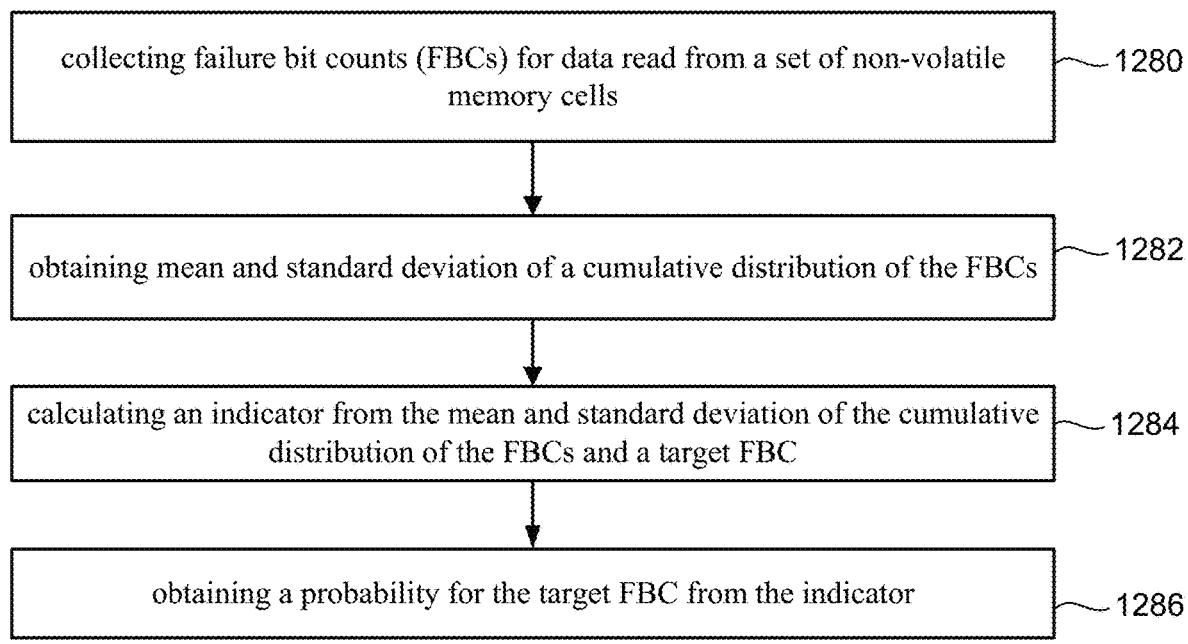
FIGS. 12A-B illustrates methods for operating a non-volatile memory.

FIG. 12A illustrates an example of a method that includes collecting failure bit counts (FBCs) for data read from a set of non-volatile memory cells (step 1280), obtaining mean and standard deviation of a cumulative distribution of the FBCs (step 1282), calculating an indicator from the mean and standard deviation of the cumulative distribution of the FBCs and a target FBC (step 1284); and obtaining a probability for the target FBC from the indicator (step 1286).

Figure 12B:
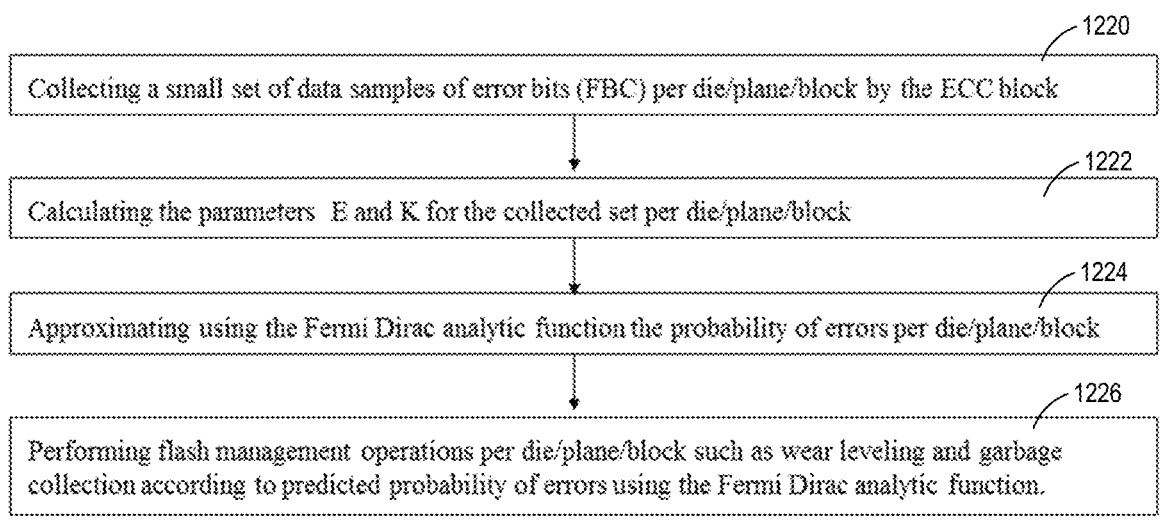

Probabilities obtained as described above may be used in a variety of ways. FIG. 12B illustrates a process that may be implemented in a memory controller such as memory controller 704 using the FD distribution. A small set of data samples of error bits (FBC) per die/plane/block (or other units) is collected by the ECC block in step 1220. Parameters E and K are then calculated for the collected set of FBC data per die/plane/block or other unit in step 1222. The Fermi-Dirac analytic function is then used to approximate the probability of errors per die/plane/block or other unit in step 1224. This may include using a table that is based on the FD distribution as shown in FIG. 9 to approximate probability of a target FBC occurring. Flash management operations are then performed per die/plane/block or other unit, such as wear leveling, garbage collection, or other operations, according to the predicted probability of errors obtained from the FD analytic function in step 1226. While specific examples are described here, it will be understood that probabilities may be used for many purposes and the present technology is not limited to a particular example.

In an embodiment, wear leveling between blocks may be performed according to probabilities of a target FBC in the blocks. In general, blocks degrade with use (i.e. they tend to wear out). Thus, a block that has been heavily used (large number of write erase cycles) generally has worse characteristics than a block that has been lightly used (small number of write erase cycles). If use is concentrated in particular blocks, these blocks tend to wear out prematurely so that they are no longer usable, thus reducing memory capacity. Wear leveling is a process that manages blocks to avoid concentrating wear so that blocks remain usable. In one example, counts of the numbers of write erase cycles (hot counts) may be maintained for each block and blocks may be managed according to their hot count to ensure that blocks have similar hot counts. A probability obtained from FBC data as described above provides an alternative approach to wear leveling. Not all blocks degrade at the same rate with use so that hot count may not accurately reflect how close a particular block is to becoming unusable (e.g. one block may wear out and become unusable after 10,000 cycles while another block may become unusable after 1,000,000 cycles). In contrast, a probability of a target FBC may accurately reflect how close a particular block is to failing and may thus provide a good basis for managing use to avoid such failure (e.g. by reducing use of any block that is close to failure).

Figure 13:
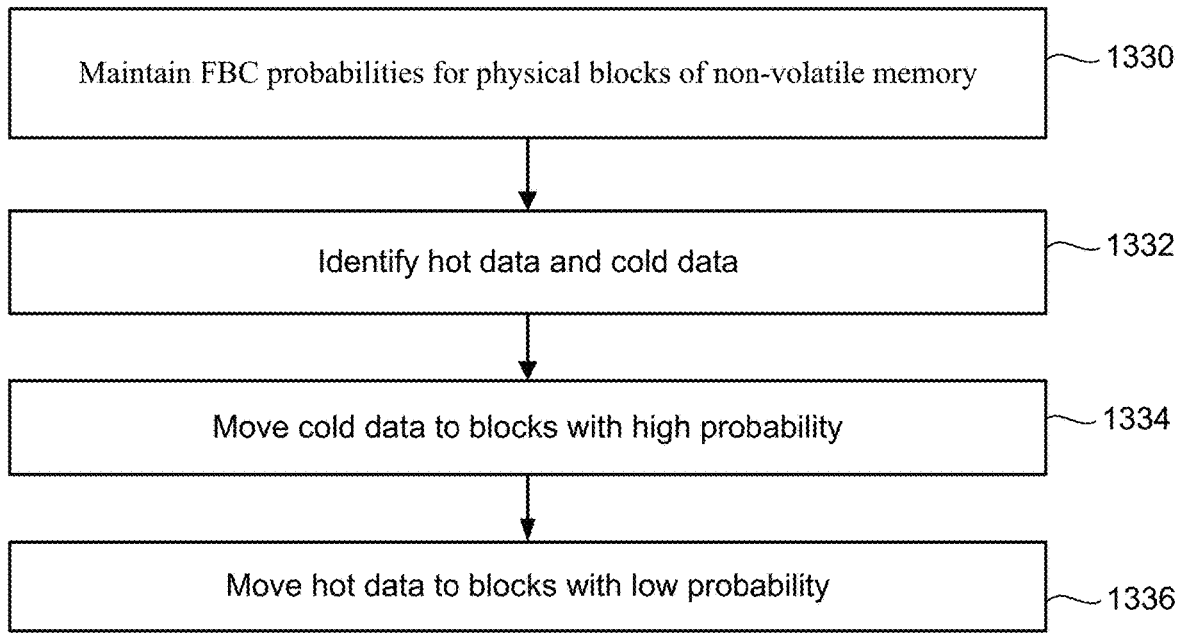
FIG. 13 illustrates a method of performing wear leveling.

FIG. 13 shows an example of wear leveling using probability values that may be obtained as described above (e.g. obtained by controller 700 as illustrated in FIGS. 9 and 10). This may be considered an example of a flash management operation of step 1226 above. FBC probabilities are maintained for physical blocks of non-volatile memory 1330 (this may be in addition to maintaining hot counts or may be used instead of maintaining hot counts). For example, FBC data may be collected when data is read from a block and this data may be used to obtain E and K values, which are then used to obtain a probability of a target FBC from a table (e.g. table of FIG. 9). The target FBC may be an FBC at which a block is considered a bad block (e.g. because data is uncorrectable, or it fails some specification, or otherwise) so that this probability corresponds to a probability of block failure. The probability changes as more FBC data is collected and E and K values are updated. Data is identified as hot and cold data 1332. For example, certain logical addresses may be identified as corresponding to hot data that is frequently rewritten while other logical addresses may be identified as corresponding to cold data that is infrequently rewritten. Cold data is then moved to blocks with a high probability 1334, i.e. a high probability of failure. Hot data is moved to blocks with a low probability 1336, i.e. a low probability of failure. In other examples, when new data is to be written, a block may be selected from an erased block pool according to a probability estimated as described above (e.g. selecting a block with the lowest probability of failure).

In an embodiment, garbage collection may be based on probabilities that are obtained as described above. This may be considered an example of a flash management operation of step 1226 above. In general, in block erasable non-volatile memory, blocks may contain both valid and invalid data and garbage collection frees up space occupied by invalid data. In a garbage collection operation, valid data is copied from one or more source blocks that contain obsolete data to a destination block, thereby making copies of the data in the source blocks invalid so that source blocks contain only invalid data. Source blocks are then erased and made available for storage of other data. Probabilities that are obtained as described above may be used to select source blocks and/or destination blocks for garbage collection. For example, source blocks may be identified because they have a high probability of reaching a target FBC. Valid data may be copied out of such blocks before it becomes difficult or impossible to correct. Destination blocks may be chosen with a low probability of reaching a target FBC so that copied data is safe in the destination blocks.

Figure 14:
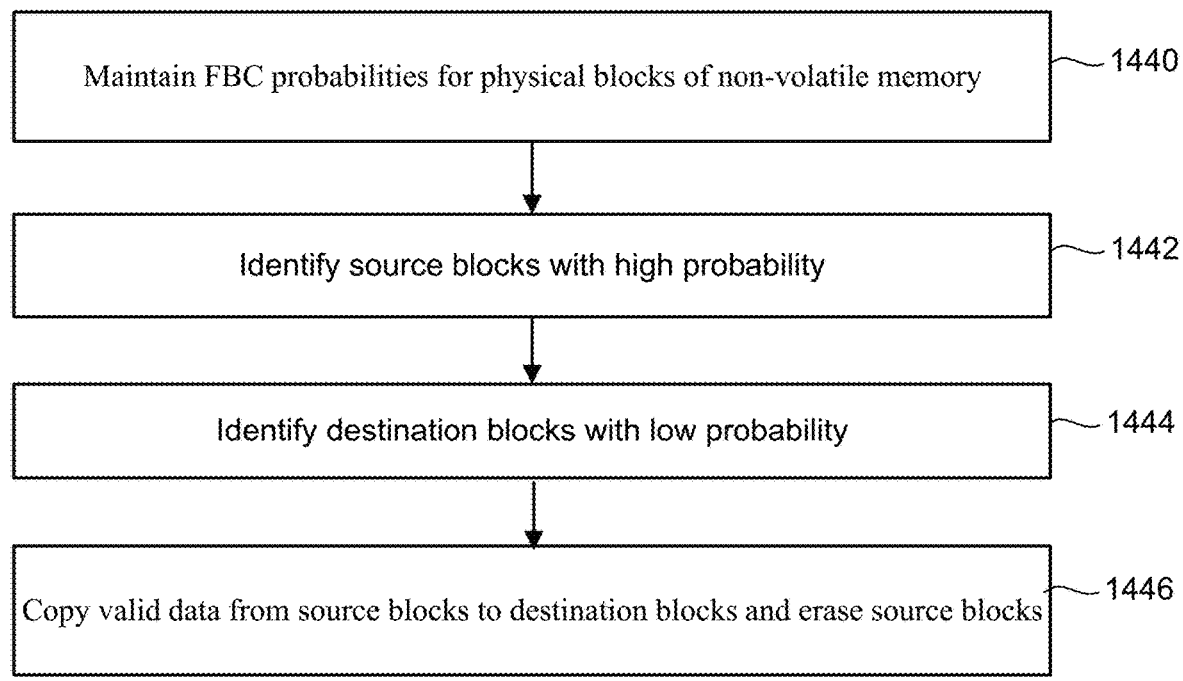
FIG. 14 illustrates a method of performing garbage collection.

FIG. 14 illustrates an example of garbage collection based on probabilities that are obtained as described above. This may be considered an example of a flash management operation of step 1226 above. FBC probabilities are maintained for physical blocks of non-volatile memory 1440. Source blocks (containing obsolete data) with high probability are identified 1442. Destination blocks (e.g. erased blocks) with low probability are identified 1444. Valid data is copied from source blocks to destination blocks and the source blocks are erased 1446. It will be understood that garbage collection may be based on a number of factors including available space remaining in memory, resources available (garbage collection may be performed in background), amount of invalid data stored, etc. Probabilities may provide an additional factor to consider in garbage collection.

In an embodiment, voltages used to access memory cells may be adjusted according to probabilities that are obtained as described above. This may be considered an example of a flash management operation of step 1226 above. For example, read threshold voltage adjustment may be performed according to probability. This may be done for a word line, block, die, or other unit. Thus, for example, read threshold voltages Vr1, Vr2 . . . Vr7 of FIG. 5 may be adjusted according to a probability of a target FBC. In some memories, threshold voltage distributions tend to change over time (e.g. because of charge leakage or other effects). Such changes may cause cells to be misread and result in increased FBC numbers and increased probability of a target FBC. In response to an increase in probability (e.g. if probability of a target FBC exceeds a predetermined value) read threshold voltages may be adjusted (e.g. lowered) to reduce FBCs and thereby reduce risk of a target FBC. Other voltages that may be adjusted include write voltages (e.g. voltages applied to word lines and bit lines during write) and erase voltages. Additionally, other parameters such as a number of write pulses, and duration of various voltages may be modified according to probability of a target FBC.

In an embodiment, read scrub operations may be based on probabilities that are obtained as described above. This may be considered an example of a flash management operation of step 1226 above. In general, when data is read and found to contain errors, a read scrub operation may be used to correct the data in memory (i.e. to clean up the copy stored in memory to correct any bad bits identified by ECC). Decisions regarding read scrub may be based on probability of a target FBC. For example, because read scrub may consume resources, it may not be desirable to perform read scrub for every failed bit. Selective use of read scrub allows reads to be performed rapidly (without read scrub) while using read scrub to correct data that is likely to reach some threshold (e.g. likely to reach a target FBC). Probability that a portion of data will reach a target FBC may provide a good indicator as to when to perform read scrub and may be better than simply using an individual FBC value. For example, a portion of data that is read with a relatively low FBC that is in a block with a high probability of reaching a target FBC may be scrubbed while a portion of data read with a relatively high FBC in a block with a low probability of reaching a target FBC may not be scrubbed. Thus, unnecessary scrubbing of outliers may be avoided while high-risk data is scrubbed.

In an embodiment, identification of bad blocks may be based on probabilities that are obtained as described above. This may be considered an example of a flash management operation of step 1226 above. In some memories, spare physical blocks are provided so that only a subset of the physical blocks is used at a given time. Blocks that are identified as "bad" blocks may be identified and marked as unavailable for subsequent use. This may occur during testing or later during use (i.e. blocks may become bad with use and may be replaced with spare blocks). In some systems, a block is marked bad when it has an FBC that is above a limit. For example, where a specification requires that an FBC of 500 has a low probability (e.g. probability $<10^{-7}$) the occurrence of an FBC of 400 might cause a block to be marked bad. However, this may cause some blocks to be marked bad due to an isolated data point (e.g. an outlier that is not a good indicator of overall block condition). Thus, a block may be discarded prematurely because of one or more unrepresentative FBC number. In contrast, using target FBC probability as described above gives a more accurate view of block condition and allows a block to remain in use even if some outlier FBC numbers indicate that the block is bad. Using target FBC probability allows blocks to be removed only when probability of a target FBC is reached (e.g. only when the probability of an FBC of 500 reaches $10^{-7}$). Using target FBC probability may also identify suspicious blocks before individual FBCs reach a high value (i.e. a value associated with bad blocks) so that resources associated with high FBC numbers (ECC time and power, RAID or other redundant system resources) may be used sparingly.

Figure 15:
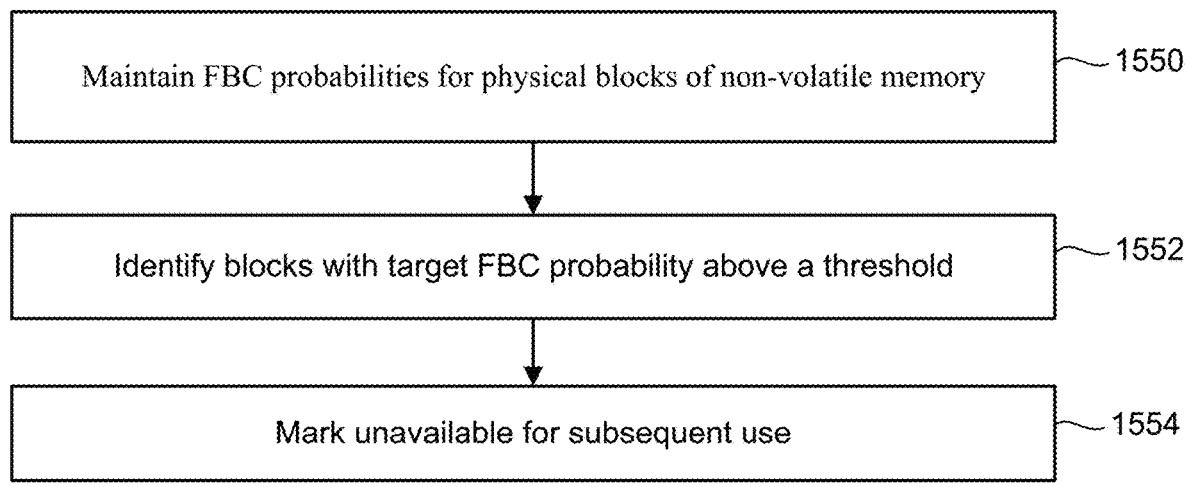
FIG. 15 illustrates a method of identifying bad blocks.

FIG. 15 shows an example of a method of managing blocks in a non-volatile memory. This may be considered an example of a flash management operation of step 1226 above. FBC probabilities are maintained for physical blocks of non-volatile memory 1550 (e.g. from FBC data, using a table as shown in FIG. 9). Blocks that have target FBC probabilities that are above a threshold probability are identified 1552 (e.g. any block with a probability of FBC=500 of $10^{-7}$ or greater). Such blocks are marked unavailable for subsequent use 1554 (i.e. marked as bad blocks).

Probabilities obtained as described above may also be used in power management. For example, some non-volatile memories may have two or more different power modes (e.g. a low-power mode and a high-power mode). Changes between such power modes may be triggered by probabilities. For example, when the probability of a target FBC reaches a predetermined level, a non-volatile memory, or a portion of a non-volatile memory (a block, a die, or other unit) may change from operating in a low-power mode to operating in a high-power mode that reduces the number of errors.

Probabilities obtained as described above may also be used in addressing temperature-related issues such as cross temperature phenomena. In some non-volatile memories, differences in temperature between write conditions and read conditions may result in errors and some compensation may be applied to correct for such temperatures (e.g. read threshold voltages may be adjusted). A probability of a target FBC may provide an indication of temperature effects so that appropriate compensation may be applied. For example, when the probability of a target FBC reaches a predetermined level, this may be taken as an indication of a cross temperature effect and appropriate compensation may be triggered. This may be instead of, or in addition to measuring and recording temperature when writing and reading data.

Figure 16:
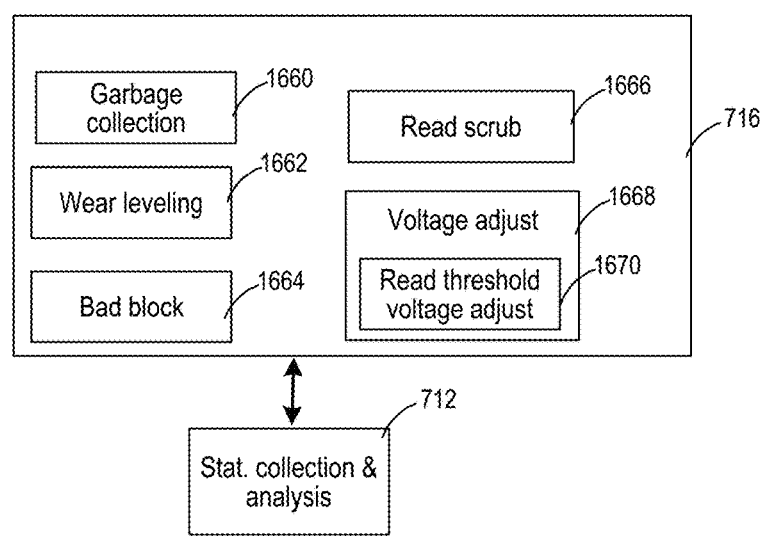
FIG. 16 illustrates components of a controller.

Memory management operations such as wear leveling, garbage collection, voltage adjustment, read scrub, bad block identification, and others may be implemented using appropriate control circuits that are in communication with a statistical collection and analysis unit so that management operations may be performed according to input that is based on statistical analysis of FBC data. FIG. 16 shows a more detailed view of memory management circuits 716 in communication with statistical collection and analysis unit 712. Memory management circuits 716 or its components shown in FIG. 16 may be considered as examples of means for operating a set of non-volatile memory cells according to probability data from the statistical collection and analysis unit 712 and/or means for modifying one or more operation directed to the set of non-volatile memory cells according to one or more FBC probabilities. Memory management circuits 716 include garbage collection circuits 1660, which are configured to use information from statistical collection and analysis unit 712 to perform garbage collection (e.g. using probabilities of a target FBC to identify source and destination blocks). Memory management circuits 716 include wear leveling circuits 1662, which are configured to use information from statistical collection and analysis unit 712 to perform wear leveling (e.g. using probabilities of a target FBC to identify blocks for hot and cold data). Memory management circuits 716 include bad block identification circuits 1664, which are configured to use information from statistical collection and analysis unit 712 to identify bad blocks (e.g. using probabilities of a target FBC to identify blocks that are approaching failure). Memory management circuits 716 include read scrub circuits 1666, which are configured to use information from statistical collection and analysis unit 712 to perform read scrub operations (e.g. using probabilities of a target FBC to identify data that should be scrubbed). Memory management circuits 716 include voltage adjustment circuits 1668, which are configured to use information from statistical collection and analysis unit 712 to adjust one or more voltages applied to elements of a non-volatile memory array. For example, read adjustment circuits 1670 adjust read threshold voltages of blocks according to a target FBC probability.

An example of a non-volatile storage apparatus includes: a set of non-volatile memory cells; and one or more control circuits in communication with the set of non-volatile memory cells, the one or more control circuits are configured to collect failure bit counts (FBCs) for data read from the set of non-volatile memory cells, obtain one or more metrics of a cumulative distribution of the FBCs, calculate an indicator from the one or more metrics of the cumulative distribution of the FBCs and a target FBC, obtain a probability for the target FBC from the indicator, and manage at least one of: garbage collection, wear leveling, and read threshold voltage adjustment of the set of non-volatile memory cells according to the probability for the target FBC.

The non-volatile storage apparatus may include a table that links a plurality of indicator values with a plurality of probabilities, and the one or more control circuits may be configured to obtain the probability for the target FBC from the indicator according to the table. The plurality of probabilities may be related to the indicator according to the equation: Probability=$1/(e^z+1)$, where z is the indicator. The one or more metrics may include mean and standard deviation of the cumulative distribution of the FBCs and the indicator, z, may be related to the mean and standard deviation of the cumulative distribution of the FBCs and the target FBC according to the equation: $z=(x-E)/K$, where x is the target FBC, E is the mean of the cumulative distribution of the FBCs and K is proportional to the standard deviation of the cumulative distribution of the FBCs. The set of non-volatile memory cells may form a non-volatile memory that is monolithically formed in one or more physical levels of arrays of memory cells having an active area disposed above a silicon substrate. The set of non-volatile memory cells may be comprised of a plurality of blocks of cells, a block of cells forming a minimum unit of erase, and the one or more control circuits may be further configured to manage operation of the plurality of blocks of cells according to a plurality of probabilities for the target FBC obtained for the plurality of blocks of cells. The one or more control circuits may be configured to select blocks for garbage collection according to the plurality of probabilities for the target FBC obtained for the plurality of blocks of cells. The one or more control circuits may be configured to select blocks for wear-leveling according to the probability for the target FBC obtained for the plurality of blocks of cells. The one or more control circuits may be configured to adjust one or more voltages applied to a block of the plurality of blocks of cells according to the probability for the target FBC obtained for the block. The one or more control circuits may be configured to adjust read threshold voltage of the block according to the probability for the target FBC obtained for the block. The one or more control circuits may be configured to mark a block of the plurality of blocks of cells as unavailable for subsequent use according to the probability for the target FBC obtained for the block.

An example of a method includes: collecting failure bit counts (FBCs) for data read from a set of non-volatile memory cells; obtaining one or more metrics of a distribution of the FBCs; calculating an indicator from the one or more metrics of the cumulative distribution of the FBCs and a target FBC; obtaining a probability for the target FBC from the indicator; and performing at least one of: garbage collection, wear leveling, and read threshold voltage adjustment, of the set of non-volatile memory cells according to the probability for the target FBC. Obtaining the probability for the target FBC from the indicator may include looking up a table that links a plurality of indicator values with a plurality of probabilities. The distribution of the FBCs may be a cumulative distribution function, the one or more metrics may include a mean and standard deviation of the cumulative distribution function, and the indicator may be related to the mean and standard deviation of the cumulative distribution of the FBCs and the target FBC according to the equation: $z=(x-E)/K$, where z is the indicator, x is the target FBC, E is the mean of the cumulative distribution of the FBCs, and K is proportional to the standard deviation of the cumulative distribution of the FBCs. The mean and standard deviation of the cumulative distribution of the FBCs may be obtained for a number of FBCs that is less than one thousand and the probability for the target FBC is of the order of 10-7. The set of non-volatile memory cells may be managed according to a plurality of probabilities for the target FBC obtained for the set of non-volatile memory cells. Managing the set of non-volatile memory cells may include performing at least one of: garbage collection, wear leveling, and read threshold voltage adjustment, of the set of non-volatile memory cells according to the plurality of probabilities for the target FBC obtained for the plurality of blocks of cells. The set of non-volatile memory cells may include a plurality of blocks, a block of cells forming a minimum unit of erase, and managing the set of non-volatile memory cells may include identifying a block as a bad block that is subsequently unavailable for use according to the plurality of probabilities for the target FBC obtained for the set of non-volatile memory cells.

An example of a system includes: a set of non-volatile memory cells; means for collecting failure bit counts (FBCs) for data read from the set of non-volatile memory cells; means for obtaining a mean and standard deviation of a cumulative distribution of the FBCs; means for calculating an indicator from the mean and standard deviation of the cumulative distribution of the FBCs and a target FBC; means for obtaining a probability for the target FBC from the indicator; and means for operating the set of non-volatile memory cells according to the probability for the target FBC.

The system may include means for performing at least one of: garbage collection, wear leveling, and read threshold voltage adjustment, of the set of non-volatile memory cells according to one or more probabilities obtained from one or more indicators.

FBC Prediction

FBC data may be used to generate a distribution, which may be extrapolated, for example, as shown in FIG. 8 (showing 1=CDF distribution). Such a distribution shows current FBC data, which is modeled so that the modeled FBC probabilities reflect the current condition of the non-volatile memory. In general, non-volatile memory degrades over time as it is used so that FBCs increase over time. Thus, a distribution such as shown in FIG. 8 would be expected to change during the lifetime of a non-volatile memory. While a single distribution could be used throughout the lifetime of a non-volatile memory based on some initial FBC data, such a distribution may not accurately reflect FBCs at a subsequent time after the non-volatile memory has been in use for some period (i.e. after significant use). In some cases, FBCs data may be collected on an ongoing basis to generate an updated FBC distribution. However, this may not always be ideal and some prediction of FBC distribution may be useful in various ways in a non-volatile storage system.

In some examples, FBC data collected in a first time period may be used to predict FBCs in a second time period that is after the first time period. Thus, FBCs may be collected in a first time period, such as an initialization or testing period, and a probability of occurrence of a target FBC in a second time period may be calculated from the FBCs collected in the first time period. Such a calculation adjusts FBC predictions to account for factors that may increase FBCs in non-volatile memory (e.g. program disturb, data retention, and/or read disturb). A model of FBC distribution change may be obtained from experimental data based on one or more one or more such factors. The probability of occurrence of a target FBC during the second time period may be calculated from such a model of FBC distribution change of the set of non-volatile memory cells.

Figure 17A:
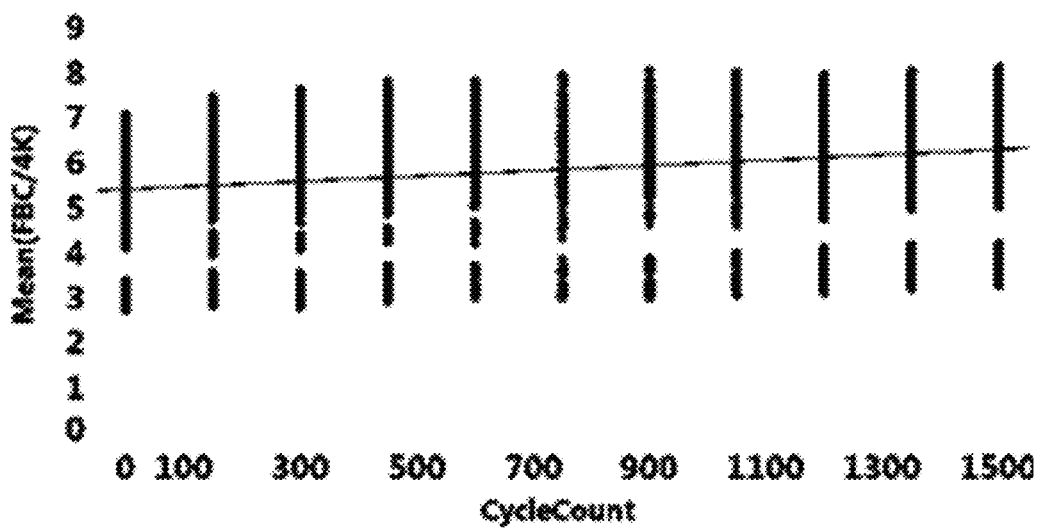
FIGS. 17A-B show examples of changing mean and standard deviation of an FBC distribution with use.
Figure 17B:
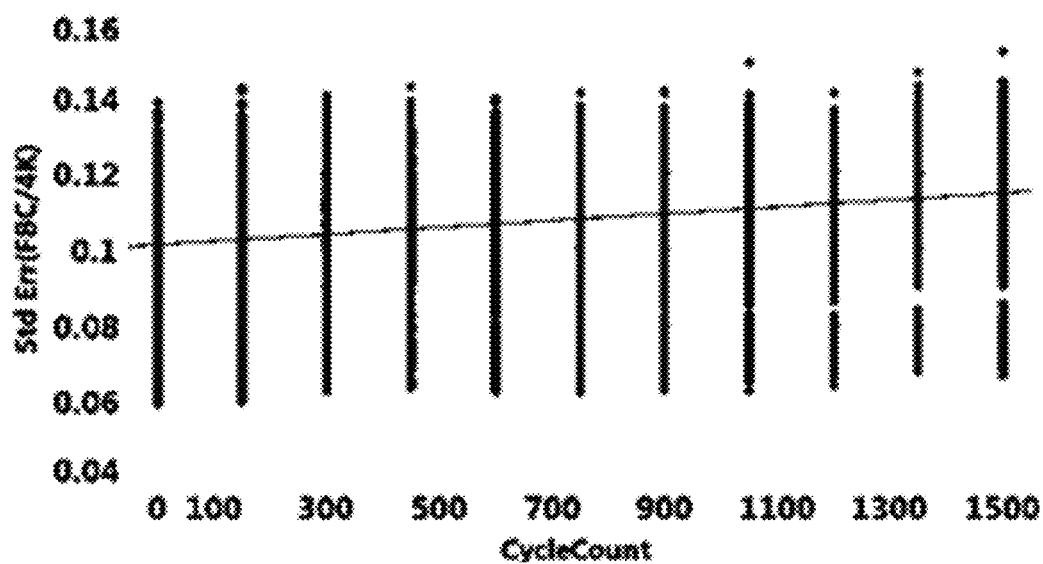

In some examples, changes in non-volatile memory characteristics, including FBC distributions, may be predictable. For example, FIGS. 17A-B show how an FBC distribution, such as the distribution illustrated as a 1-CDF distribution of FIG. 8, may change as a memory is used. FIG. 17A illustrates mean FBC for a population of 4 kB data words read from a non-volatile memory at different times during the lifetime of a non-volatile memory, for up to 1500 write-erase cycles (cycle count from 0 to 1500 on x-axis and mean FBC/4 KB on the y-axis). It can be seen that the mean FBC trends upwards with increasing cycle count in an approximately straight-line manner. FIG. 17B illustrates the standard deviation of the FBC distribution for the same population over the same period as FIG. 17A (cycle count from 0 to 1500 on x-axis and standard deviation of FBC/4 KB on the y-axis). It can be seen that the standard deviation trends upwards with increasing cycle count in an approximately straight-line manner.

Figure 18A:
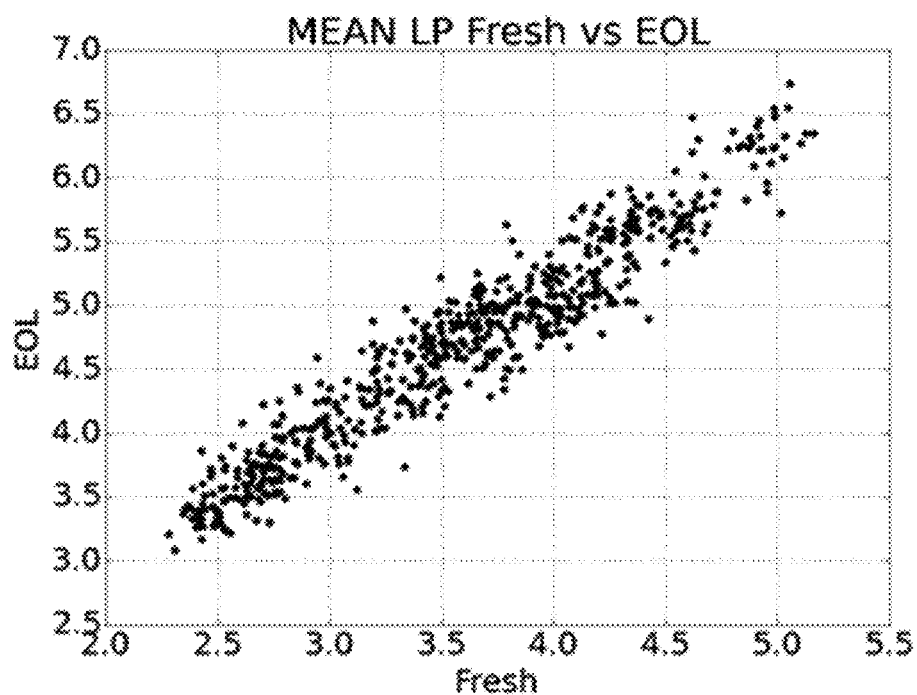
FIGS. 18A-B illustrate examples of changing mean and standard deviation of mean and standard deviation of FBCs with use.
Figure 18B:
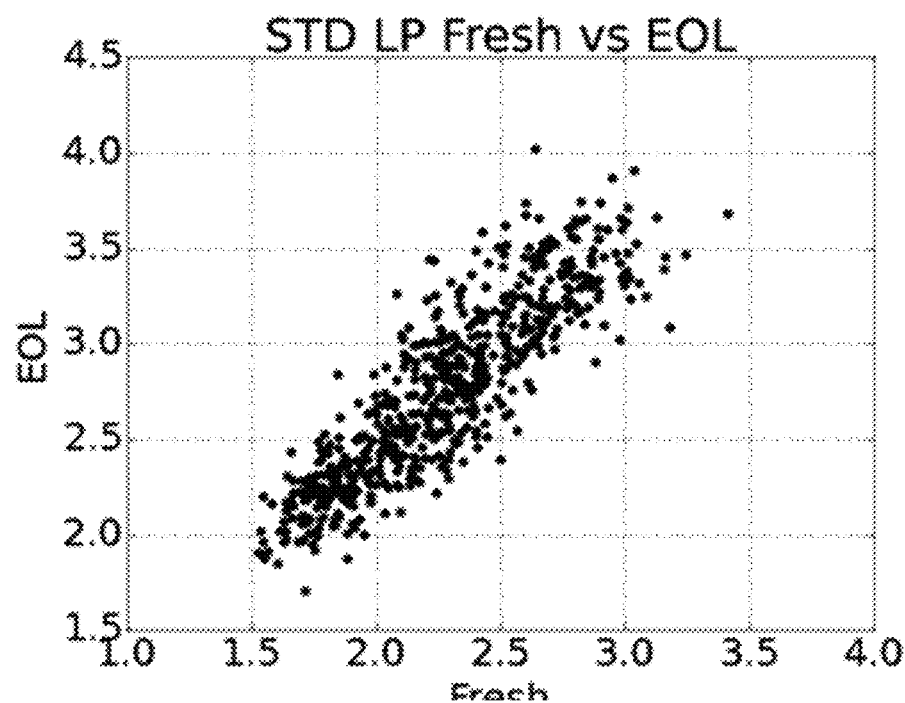

FIGS. 18A-B provide additional illustrations of observed changes in non-volatile memory over the lifetime of a product as shown in FIGS. 17A-B, e.g. for non-volatile memory 702 of FIG. 7. FIG. 18A shows how FBC data from fresh non-volatile memory units (units with little or no prior use, shown on x-axis) correlates with FBC data from end-of-life (EOL) non-volatile memory units (i.e. non-volatile memory units that have experienced significant use and may be considered to be at or near the end of their useful life, shown on y-axis). FIG. 18A shows a correlation between mean FBC for fresh non-volatile memory and mean FBC for EOL memory. In general, non-volatile memory units with low initial mean FBC have relatively low mean FBC when they are at EOL and non-volatile memory units with high initial mean FBC have relatively high mean FBC when they are at EOL, with all non-volatile memory units having increased mean FBC with use. Thus, for example, anon-volatile memory unit with an initial mean FBC of 2.5 may have a mean FBC of about 3.5 at EOL while a non-volatile memory unit with an initial mean FBC of 5.0 may have a mean FBC of about 6.3 at EOL.

FIG. 18B shows correlation between standard deviation of FBC distributions between non-volatile memory units that are fresh (on x-axis) and non-volatile memory units at EOL (on y-axis). In general, non-volatile memory units with small initial FBC standard deviation have relatively small standard deviation when they are at EOL and non-volatile memory units with large initial FBC standard deviation have relatively large FBC standard deviation when they are at EOL, with all non-volatile memory units having increased FBC standard deviation with use. Thus, for example, a non-volatile memory unit with an initial FBC standard deviation of 1.7 may have an FBC standard deviation of about 2.0 at EOL while a non-volatile memory unit with an initial FBC standard deviation of about 3.0 may have an FBC standard deviation of about 3.7 at EOL.

In some examples, changes in non-volatile memory may be modeled to generate predictions as to how a non-volatile memory will change with use. Various factors may cause increases in FBC. Such factors include program disturb, which refers to the effect that programming of new data has on data stored in other non-volatile memory cells, and which may be tested by repeated write cycles. Another factor is data retention, which refers to the tendency of data in non-volatile memory cells to change with time (e.g. through charge leakage) and which may be tested by accelerating data retention effects by increasing temperature (e.g. maintaining memory dies in an oven for some hours to simulate longer periods at room temperature). Yet another factor is read disturb, which refers to the effects that reading data has on data stored in other non-volatile memory cells that are not being read. Other effects may also cause changes in data stored in non-volatile memory cells and may also be modeled.

Figure 19A:
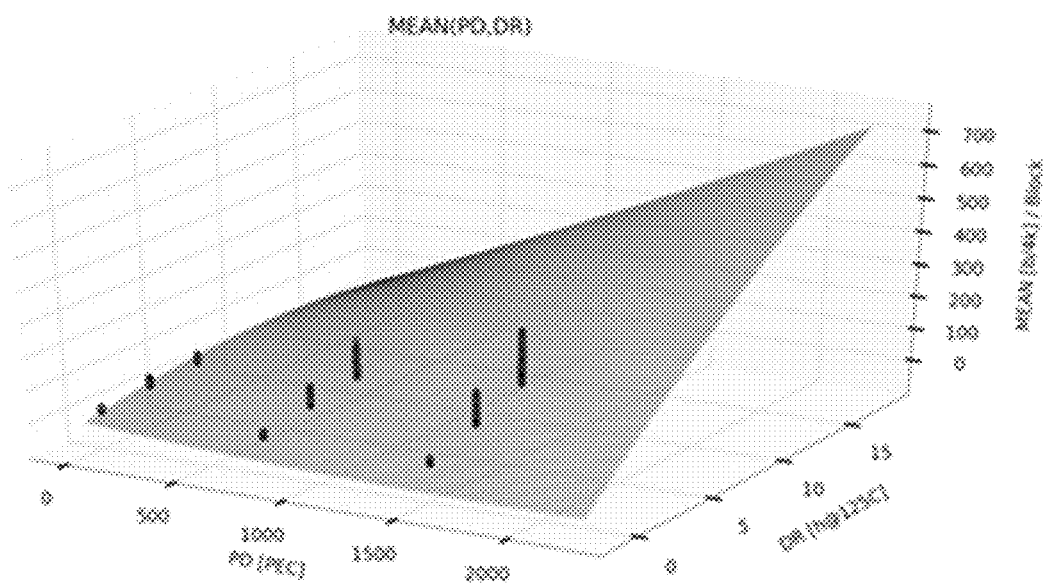
FIGS. 19A-B illustrate examples of modelling of changing mean and standard deviation of an FBC distribution.
Figure 19B:
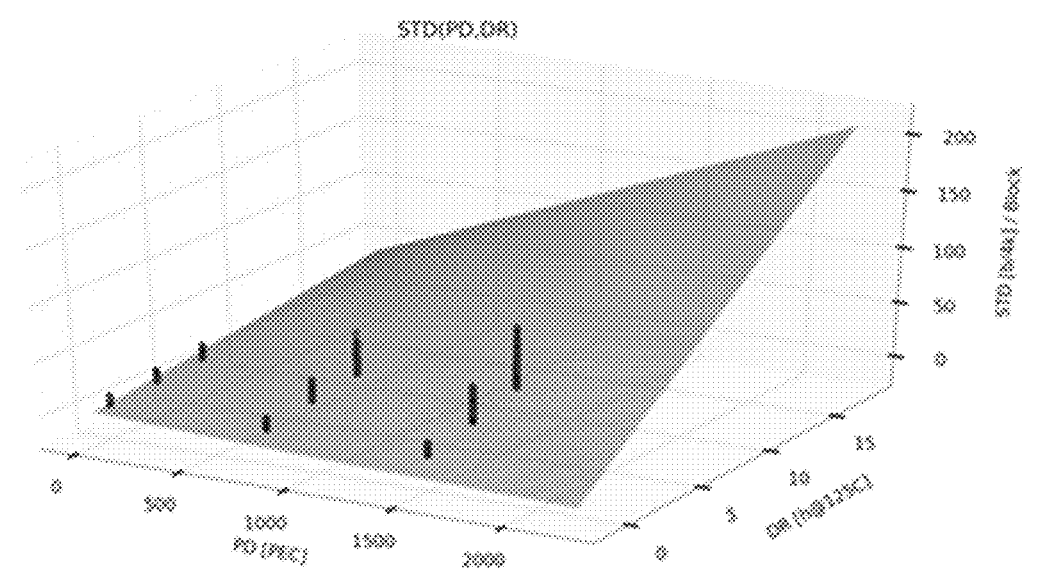

FIGS. 19A-B illustrate examples of modelling of FBC distribution change, e.g. as shown by results shown in FIGS. 18A-B, that may be used to predict FBC distributions and thus predict probabilities of particular target FBCs. Modelling in the example of FIGS. 19A-B is based on two factors, program disturb and data retention, although other factors may be used instead of, or in addition to these factors. A two-dimensional polynomial fit is used to approximate experimental results for mean FBC and FBC standard deviation as a function of program disturb and data retention effects. It will be understood that just one factor could be used, or more than two factors could be used depending on the non-volatile memory in question and the accuracy desired. Thus, a model of FBC distribution change may be generated for any non-volatile memory based on factors chosen for that non-volatile memory. In some cases, a relatively small number of samples may be used to generate a model of FBC distribution change that can then be applied to a large number of non-volatile memories. The changes to FBC distribution may be assumed to be similar for similar non-volatile memories so that once a model is developed for a non-volatile memory it may be used for all similar memories. A model of FBC distribution change may be saved in the form of a table, equation, or other format so that it can be applied by a non-volatile storage system to predict FBC distributions throughout the lifetime of a non-volatile memory. Such a model may be provided in firmware or otherwise so that memories of a common design that may be expected to change similarly with use may apply the same model. Such a model may be obtained from experimental data and/or software modeling of factors affecting FBCs.

FIG. 19A shows an example of a model of mean FBC change (e.g. change illustrated by experimental data of FIGS. 17A and 18A) based on two factors, program disturb (PD) and data retention (DR), which are represented on the horizontal axes and with mean FBC on the vertical axis. PD may be considered a measure of device age and is correlated with the program erase cycle (PEC). DR is a measure of charge loss by memory cells measured in time, typically years, and in lab experiments in hours at high temperature (according to JEDEC for example, DR of 125 Celsius for 10 hours is equivalent to a 1 year DR at room temperature). Mean FBC ("MEAN(PD,DR)") is expressed in mean failed bits per 4 KB unit in a block ("(b/4 k)/Block"). Program disturb (PD) is indicated by the number of program/erase cycles ("PEC") from 0 to 2000 based on samples at 0, 750 and 1500 program/erase cycles. Data retention (DR) is indicated by time in hours at 125 degrees centigrade ("h@125 C") from 0 to 25 hours based on samples at 0, 3, and 6 hours (e.g. non-volatile memory dies are "baked" at elevated temperature to accelerate DR effects). This may be converted to years at room temperature. It can be seen that the mean FBC increases with as a function of program disturb and data retention values, i.e. the mean FBC of a block increases with the number of program/erase cycles and with time.

The surface in the example shown in FIG. 19A is fitted to the experimental data and is described by the following polynomial approximation:

$$\text{MEANCURVE}(PD,DR)=13.52-0.02*PD+18.50*DR+0.03*PD*DR-1.45*DR^2 \quad \text{Equation 7.}$$

Where MEANCURVE(PD,DR) is the mean FBC value predicted from PD and DR values, PD is the program disturb value in program/erase cycles (PEC), and DR is the data retention value in hours at 125 degrees Celsius (or years at room temperature). Thus, the mean of an FBC distribution may be predicted for a non-volatile memory at various time periods throughout its lifetime according to the effects of program disturb and data retention (or based on other factors). Predictions regarding FBC distributions, e.g. regarding metrics such as the mean of an FBC distribution may be made in a simple manner using a polynomial or other approximation that allows such predictions to be made in a non-volatile storage system.

FIG. 19B shows an example of a model of FBC standard deviation change (e.g. change illustrated by experimental data of FIGS. 17B and 18B) based on the same two factors as FIG. 19A, with program disturb (PD) and data retention on the horizontal axes and FBC standard deviation ("STD (PD,DR)") on the vertical axis. FBC standard deviation is expressed in mean failed bits per 4 KB unit in a block ("(b/4 k)/Block"), i.e. using the same units as used for mean FBC in FIG. 19A. Program disturb (PD) is indicated by the number of program/erase cycles ("PEC") from 0 to 2000. Data retention (DR) is indicated by time in hours at 125 degrees centigrade ("h@125 C") from 0 to 25 hours. This may also be expressed as years at room temperature. It can be seen that FBC standard deviation increases as a function of program disturb and data retention factors, i.e. the FBC distribution becomes wider with increasing program/erase cycles and with time.

The surface in the example shown in FIG. 19B is fitted to the experimental data and is provided by the following polynomial approximation:

$$\text{STDCURVE}(PD,DR)=5.53-0.0005*PD+3.14*DR+0.006*PD*DR-0.02*DR^2 \quad \text{Equation 8.}$$

Where STDCURVE(PD,DR) is the FBC standard deviation value predicted from PD and DR values, PD is the program disturb value in program/erase cycles (PEC), and DR is the data retention value in hours at 125 degrees Celsius. Thus, the FBC standard deviation of an FBC distribution may be predicted for a non-volatile memory at various time periods throughout its lifetime according to the effects of program disturb and data retention (or based on other factors). Predictions regarding FBC distributions, e.g. regarding metrics such as the mean of an FBC distribution may be made in a simple manner using a polynomial or other approximation that allows such predictions to be made in a non-volatile storage system. While the above equations are simple approximations, more terms may be used to refine curve fitting (e.g. including a PD square term, which is omitted in the above equations because its effect was small).

It will be understood that the models of equations 7 and 8 are examples obtained from particular experimental data collected from a particular population of non-volatile memory dies and that other models may be generated from other populations using the same factors, or other factors. In general, such a model may be applied to all similar products. In some cases, an individual model may be generated and applied to a particular lot, die, or other unit so that modeling is not limited to any particular implementation.

Predictions of FBC distributions, e.g. prediction of metrics of a distribution of the FBCs at some time period in the lifetime of a non-volatile memory, including mean FBC and FBC standard deviation, may be used to operate a non-volatile memory in a manner that takes into account the changing distribution. For example, a set of non-volatile memory cells may be operated according to the probability of occurrence in some time period of a target FBC and such a probability may be obtained from an FBC distribution. Any of the operations that may be modified according to a current FBC distribution in examples described above, including garbage collection, wear leveling, and read threshold voltage adjustment of a set of non-volatile memory cells may be modified according to a model of a probability of occurrence of a target FBC in different time periods. While FBC data may be collected at various times and used to generate a real-time or near real-time FBC distribution, a model may be used to calculate a probability of occurrence in a second time period of a target FBC based on FBC data obtained in a first time period (e.g. the first time period may be an initialization period or testing period and the second time period may be any subsequent time period, e.g. after some substantial use). The probability of occurrence during the second time period may be calculated from one or more metrics of the distribution of the FBCs of the first time period according to a model of FBC distribution change. This may allow an FBC distribution at a later time period during the lifetime of a non-volatile memory to be predicted from an FBC distribution at an earlier time period. For example, FBCs may be collected for data read from a set of non-volatile memory cells in a first time period and may be used to calculate the probability of occurrence in a second time period of a target FBC based on metrics of the distribution of the FBCs of the first time period according to a model of FBC distribution change. The probability of occurrence of the target FBC in the second period may then be used to manage one or more operations such as: garbage collection, wear leveling, and read threshold voltage adjustment.

A model of FBC distribution change over the lifetime of a set of non-volatile memory cells allows a distribution such as a 1-CDF (or SFR) distribution of FBCs to be predicted also, for example, using an FD function to model an SFR function for one or more time periods in the future. The following approximation may apply:

$$SFR_f(FBC) \approx FD(FBC, MEAN_f, STD_f) \quad \text{Equation 9.}$$

Where $SFR_f(FBC)$ is the SFR (or 1-CDF) distribution of a population of FBCs in a future time period, FD is the Fermi-Dirac function, $MEAN_f$ is the mean FBC at the future time period, and $STD_f$ is the FBC standard deviation at the future time period. $MEAN_f$ and $STD_f$ may be predicted based on factors such as PD and DR as described above to provide the following approximation:

$$SFR_f(FBC) \approx FD(FBC, MEANPREDICTED(MEAN_0, PD_0, DR_0, PD_f, DR_f), STDPREDICTED(STD_0, PD_0, DR_0, PD_f, DR_f)) \quad \text{Equation 10.}$$

Where $MEANPREDICTED(MEAN_0, PD_0, DR_0, PD_f, DR_f)$, the predicted mean, is an approximation of $MEAN_f$ based on $MEAN_0$ (the mean at time zero, or initial time period), $PD_0$ (PD value at time zero), $DR_0$ (DR value at time zero), $PD_f$ (PD at future time period), and $DR_f$ (DR value at future time period) and $STDPREDICTED(STD_0, PD_0, DR_0, PD_f, DR_f)$, the predicted standard deviation, is an approximation of $STD_f$ based on $STD_0$ (standard deviation at time zero, or initial time period), $PD_0$, $DR_0$, $PD_f$, and $DR_f$.

$MEANPREDICTED(MEAN_0, PD_0, DR_0, PD_f, DR_f)$ may be further approximated as follows:

$$MEANPREDICTED(MEAN_0, PD_0, DR_0, PD_f, DR_f) = \quad \text{Equation 11}$$
$$MEAN_0 + \left(1 + \alpha \cdot \frac{MEAN_0 - MEANCURVE(PD_0, DR_0)}{MEANCURVE(PD_0, DR_0)}\right) \cdot$$
$$(MEANCURVE(PD_f, DR_f) - MEANCURVE(PD_0, DR_0)).$$

Where $\alpha$ is a constant representing correlativity of the relative error between initial and future PD and DR values, i.e. between $PD_0$, $DR_0$ and $PD_f$, $DR_f$. Thus, $\alpha$ may be considered a tuning parameter that may be determined per lot, per device, or for some other unit. $MEANCURVE(PD_f, DR_f)$ may be obtained from a model such as provided by Equation 7 above.

$STDPREDICTED(STD_0, PD_0, DR_0, PD_f, DR_f))$ may be further predicted as follows:

$$STDPREDICTED(STD_0, PD_0, DR_0, PD_f, DR_f) = \quad \text{Equation 12}$$
$$STD_0 + \left(1 + \beta \cdot \frac{STD_0 - STDCURVE(PD_0, DR_0)}{STDCURVE(PD_0, DR_0)}\right) \cdot$$
$$(STDCURVE(PD_f, DR_f) - STDCURVE(PD_0, DR_0)).$$

Where $\beta$ is a constant representing correlativity of the relative error between initial and future PD and DR values, i.e. between $PD_0$, $DR_0$ and $PD_f$, $DR_f$. Thus, $\beta$ may be considered a tuning parameter that may be determined per lot, per device, or for some other unit. $STDCURVE(PD_f, DR_f)$ may be obtained from a model such as provided by Equation 8 above.

A cumulative distribution function for some period in the future may be modeled using a FD distribution as described above (e.g. equation 2 or 6) based on such MEANPREDICTED and STDPREDICTED values (e.g. from equations 11 and 12) according to the following equation:

$$FD(FBC_{target}, E = MEANPREDICTED( \quad \text{Equation 13}$$
$$MEAN_0, PD_0, DR_0, PD_f, DR_f), K =$$
$$0.5 * STDPREDICTED(STD_0, PD_0, DR_0, PD_f, DR_f)).$$

Where $FBC_{target}$ is the FBC target value (i.e. the model may provide probability of occurrence of this FBC), E is approximated by $MEANPREDICTED(MEAN_0, PD_0, DR_0, PD_f, DR_f)$, and K is approximated by $0.5*STDPREDICTED(STD_0, PD_0, DR_0, PD_f, DR_f)$, for example, as E and K values in equations 2 or 6 above. In some cases, the mean of a distribution of FBCs may be approximated using an offset, or estimated changes, e.g. by the following approximation:

$$MEAN_{final} \approx MEAN_0 + \Delta MEAN_{0 \rightarrow f}$$ Equation 14.

Where the offset $\Delta MEAN_{0 \rightarrow f}$ may be obtained from a model of change in mean over the lifetime of a non-volatile memory, e.g. as indicated in equation 7 above, thus providing the following:

$$\Delta MEAN_{0 \rightarrow f} \approx MEANCURVE(PD_f, DR_f) - MEANCURVE(PD_0, DR_0)$$ Equation 15

In general, an offset such as $\Delta MEAN_{0 \rightarrow f}$ may be corrected for a specific block or other unit relative to a larger population of blocks. This may be done using a term to account for relative error, e.g. by multiplying by a constant factor such as $$\left(1 + \frac{MEAN_0 - MEANCURVE(PD_0, DR_0)}{MEANCURVE(PD_0, DR_0)}\right) \text{ or}$$

$$\left(1 + \alpha \cdot \frac{MEAN_0 - MEANCURVE(PD_0, DR_0)}{MEANCURVE(PD_0, DR_0)}\right)$$

as in equation 11, where using $\alpha$ may reduce the effect of relative error, i.e. may reduce the effect of any correlation differences, and may be considered a tuning factor. A similar constant factor, $$\left(1 + \beta \cdot \frac{STD_0 - STDCURVE(PD_0, DR_0)}{STDCURVE(PD_0, DR_0)}\right),$$

may be applied to obtain a predicted standard deviation value as shown in equation 12, where $\beta$ may reduce the effect of relative error and may be considered a tuning factor. Tuning factors such as $\alpha$ and $\beta$ may be specific to a particular unit such as a block, plane, die, wafer, lot, or other unit.

Figure 20:
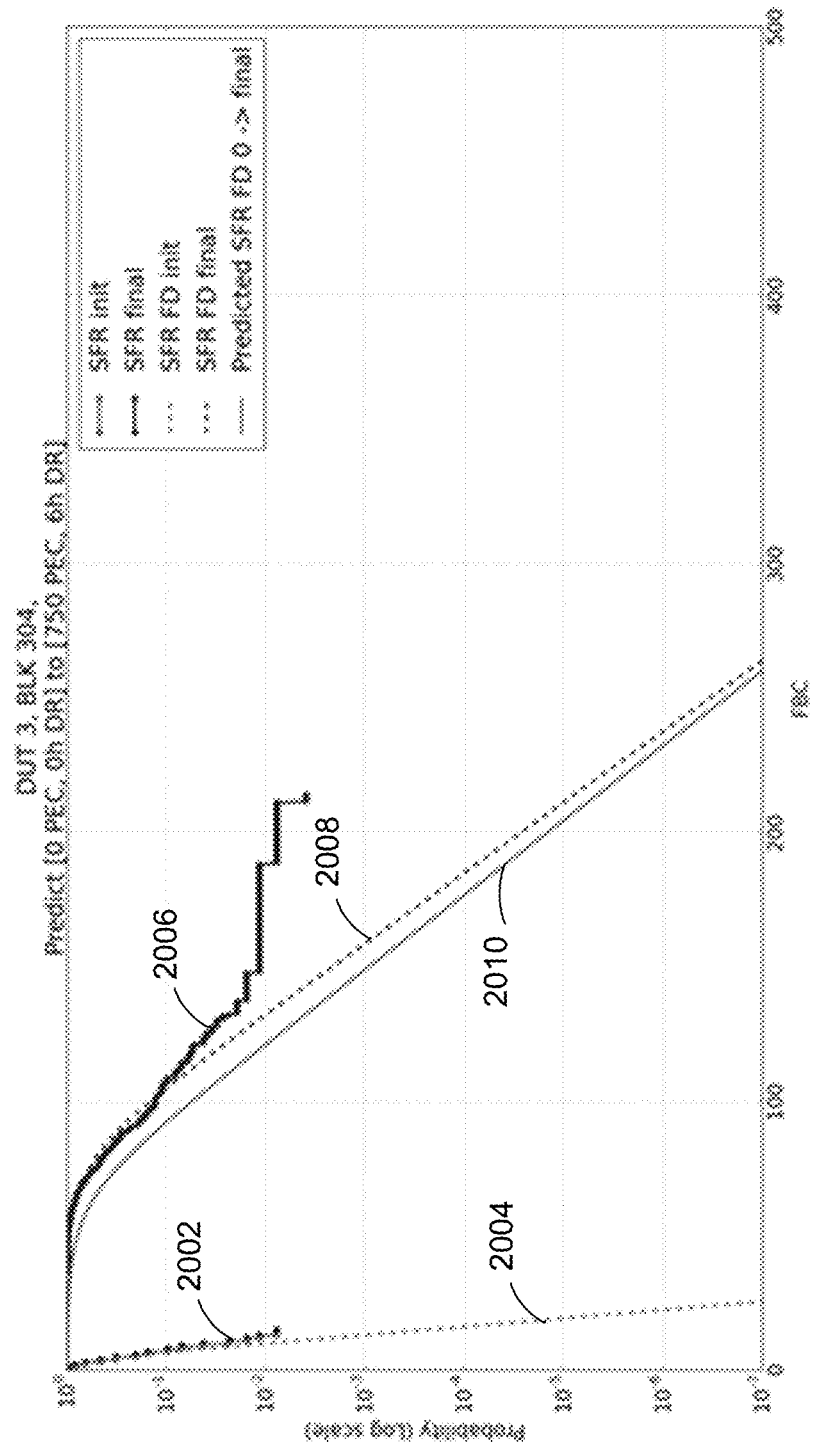
FIG. 20 illustrates an example of how a model of FBC distribution change may predict an FBC distribution.

FIG. 20 illustrates an example of how a model of FBC distribution change of a set of non-volatile memory cells may be implemented to predict an FBC distribution of a second time period from FBCs collected from data read in a first time period. FBC values are shown on the horizontal axis and probability is shown on the vertical axis (as in FIG. 8 above). FIG. 20 includes an SFR (1-CDF) plot 2002 that shows FBCs for data read from a set of non-volatile memory cells in a first time period (an initial period). FIG. 20 also shows a plot 2004 of an FD function based on the mean and standard deviation of the data read from the set of non-volatile memory cells in the first time period. Thus, plot 2004 is based on a model using the data of plot 2002 that may provide a real-time or near real-time prediction of a probability of occurrence of a target FBC, e.g. a prediction in the first time period that is based on data collected in the first time period.

FIG. 20 also includes a plot 2006 that shows FBCs for data read from the same set of non-volatile memory cells in a second time period. The second time period is a later time period, after significant change has occurred in this example. While the first period corresponds to an initial period where non-volatile memory cells may be considered new or fresh, the second time period corresponds to a time period when cells have experienced the effects of different factors that change their characteristics. Specifically, the non-volatile memory cells were subjected to significant program disturb and data retention stress by subjecting them to 750 program/erase cycles ("750 PEC") and six hours at 125 degrees centigrade ("6 h DR"). FIG. 20 also shows a plot 2008 of an FD function based on the mean and standard deviation of the data read from the set of non-volatile memory cells in the second time period. Thus, plot 2008 is based on the data of plot 2006 that may provide a real-time or near real-time prediction of a probability of occurrence of a target FBC, e.g. a prediction in the second time period that is based on data collected in the second time period.

FIG. 20 also includes plot 2010, which is a plot of FBC probability that is obtained by applying a model of FBC distribution change to FBC data obtained in the first time period. Thus, the mean and standard deviation values obtained from the data of plot 2002 (FBCs for data read from the set of non-volatile memory cells in the first time period) are used to generate plot 2010, which corresponds to the second time period. For example, mean and standard deviation used to generate plot 2010 may be obtained from mean and standard deviation values of FBC data of plot 2002 by applying an offset (e.g. as indicated by equation 15) or may be calculated using polynomial approximations for certain factors (e.g. as indicated by equations 7 and 8) or otherwise. For example, program disturb and data retention effects may be used to generate a model that may be represented as one or more equations, tables, or other structures. It can be seen that plot 2010, which is generated from the FBC data of the first time period is correlated with plot 2006, which is the FBC data from the second time period and that plot 2008, which is generated from FBC data from the second time period is similar to plot 2010, thus indicating an accurate prediction. In some examples, a first time period may correspond to a beginning-of-life (BOL) time period when non-volatile memory cells are fresh (unused or substantially unused) and a second time period may correspond to an end-of-life (EOL) time period when non-volatile memory cells are nearing the end of their useful life (e.g. error rates are at or near the limits of ECC correction). In other examples, the first period may be after a BOL time period and in some examples a second time period may be prior to an EOL time period. Aspects of the present technology may facilitate predictions for any second time period based on data from any prior first time period.

In some non-volatile memory systems, FBC data may be collected only in a first time period such as an initialization and testing time period and this data may be sufficient to predict FBC probabilities throughout the lifetime of a product. In some non-volatile memory systems, FBC data may be collected at different time periods throughout the lifetime of a product so that FBC probabilities may be updated to reflect real-time or near real-time data. In some non-volatile memory systems, a combination of approaches may be used to provide FBC probabilities, predictions may be based on FBC data collected during a first time period according to a model of FBC distribution change and such predictions may be further based on FBC data collected during a second time period so that the model may be adjusted according to FBC data as the FBC data is collected. Aspects of the present technology may be combined with other techniques, such as memory health algorithms that may collect data on blocks in a non-volatile memory in order to identify any abnormal behavior.

Figure 21:
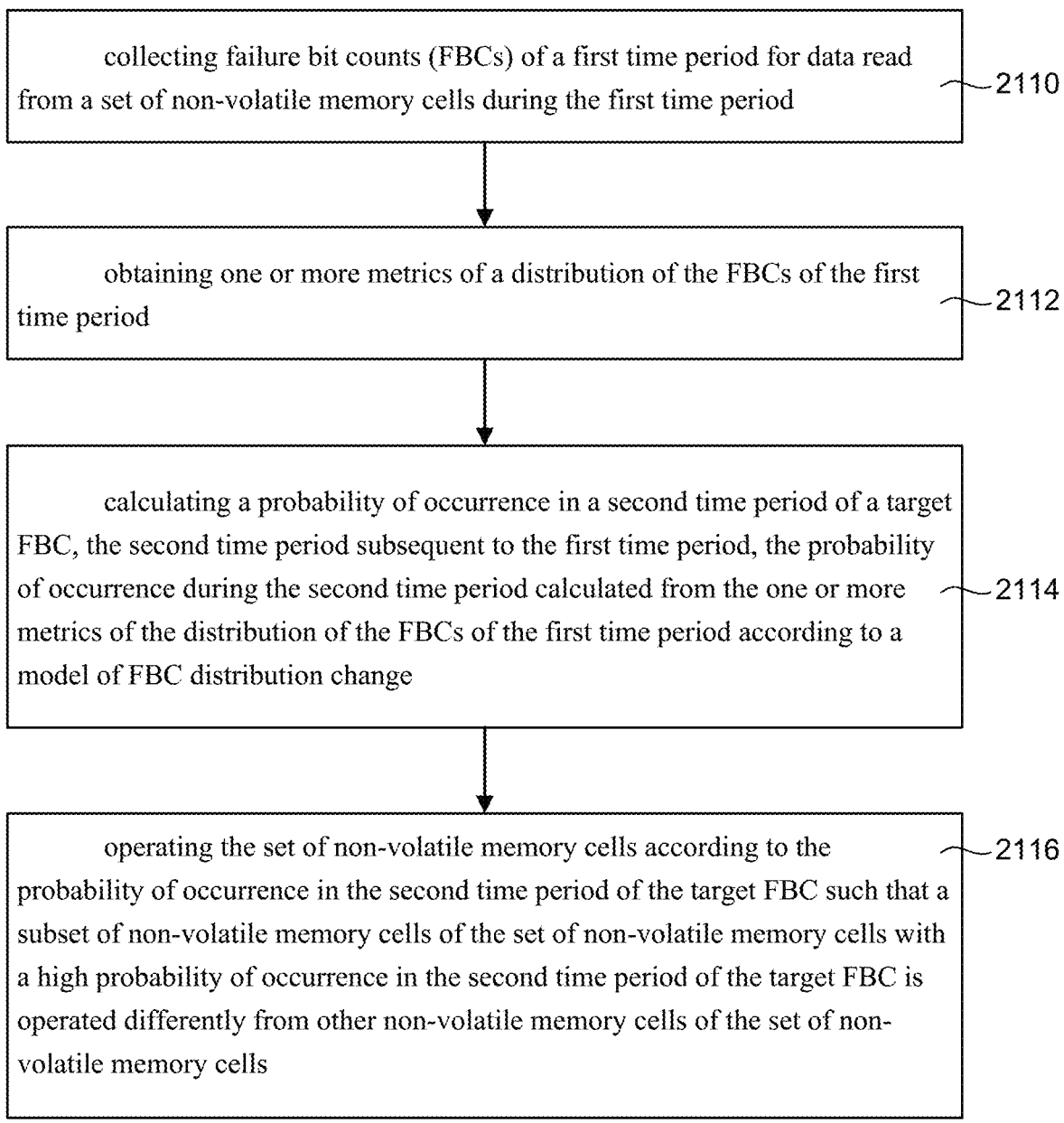
FIG. 21 illustrates a method that includes calculating a probability of a target FBC in a second time period and operating a set of non-volatile memory cells according to the probability.

FIG. 21 illustrates an example of a method that may be implemented in a non-volatile memory system, for example a non-volatile memory system 700 of FIG. 7. FIG. 21 shows step 2110, which includes collecting failure bit counts (FBCs) of a first time period for data read from a set of non-volatile memory cells during the first time period and step 2112, which includes obtaining one or more metrics of a distribution of the FBCs of the first time period. Such metrics may include mean and standard deviation values for example. FIG. 21 also shows step 2114, which includes calculating a probability of occurrence in a second time period of a target FBC, the second time period subsequent to the first time period, the probability of occurrence during the second time period calculated from the one or more metrics of the distribution of the FBCs of the first time period according to a model of FBC distribution change. Thus, for example, mean and standard deviation values from the first time period may be used with a model of FBC distribution change to generate FBC probabilities for the second time period (e.g. as a predicted FBC distribution of the second time period). FIG. 21 further shows step 2116, which includes operating the set of non-volatile memory cells according to the probability of occurrence in the second time period of the target FBC such that a subset of non-volatile memory cells of the set of non-volatile memory cells with a high probability of occurrence in the second time period of the target FBC is operated differently from other non-volatile memory cells of the set of non-volatile memory cells. Such operation may include garbage collection, wear leveling, read threshold voltage adjustment, bad block identification, power control, read scrub scheduling, ECC mode selection, and other functions.

For example, FBCs may be recorded for a plurality of blocks (or other units) of non-volatile memory cells in a first time period and the probability of occurrence of the target FBC during the second time period may be calculated from the FBC data of the first time period according to a model of FBC distribution change. The order of garbage collection of the plurality of blocks in the second time period may be determined according to such probability, for example, by garbage collecting a block that has a high probability of a target FBC (e.g. an FBC corresponding to data that is uncorrectable by ECC, or UECC) ahead of a block with a lower probability of the target FBC in the second time period.

Figure 22:
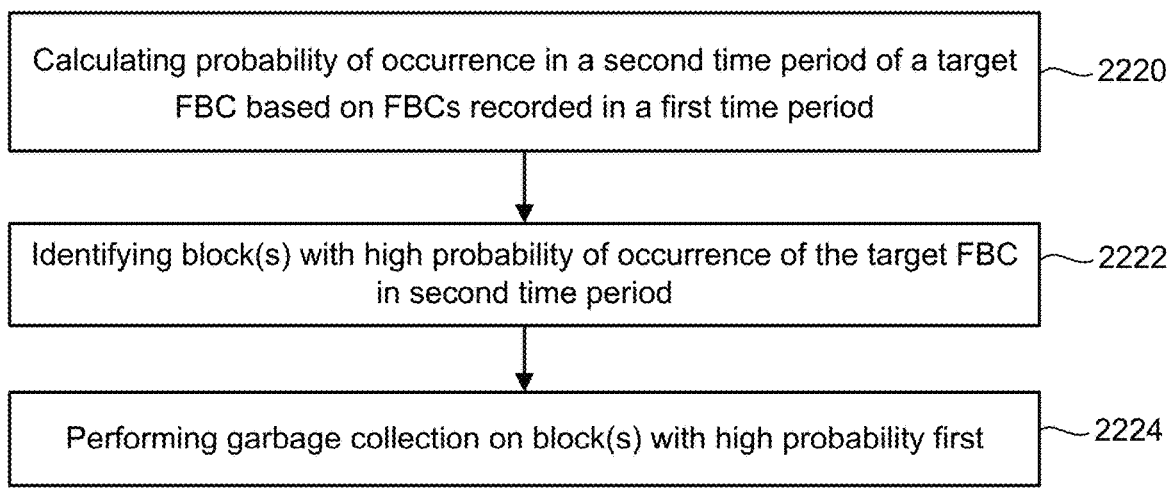
FIG. 22 illustrates an example of performing garbage collection according to the probability of occurrence in a second time period of a target FBC.

FIG. 22 shows an example of operating a set of non-volatile memory cells according to the probability of occurrence in a second time period of the target FBC such that a subset of non-volatile memory cells (one or more blocks in this example) of the set of non-volatile memory cells with a high probability of occurrence in the second time period of the target FBC is operated differently from other non-volatile memory cells of the set of non-volatile memory cells. FIG. 22 shows calculating probability of occurrence in a second time period of a target FBC based on FBCs recorded in a first time period 2220 and identifying block(s) with high probability of occurrence of the target FBC in the second time period 2222 (e.g. as described in examples above). FIG. 22 also shows performing garbage collection on block(s) with high probability first 2224 (e.g. garbage collection operations may be reordered according to probability of occurrence of the target FBC so that block(s) with high probability are moved up in priority and garbage collected earlier.

The probability of occurrence of the target FBC during the second time period may also be used to identify blocks for wear leveling operations, e.g. identifying a first block with a higher probability of a target FBC and a second block with a lower probability of the target FBC for a wear leveling operation to move data from the first block to the second block.

Figure 23:
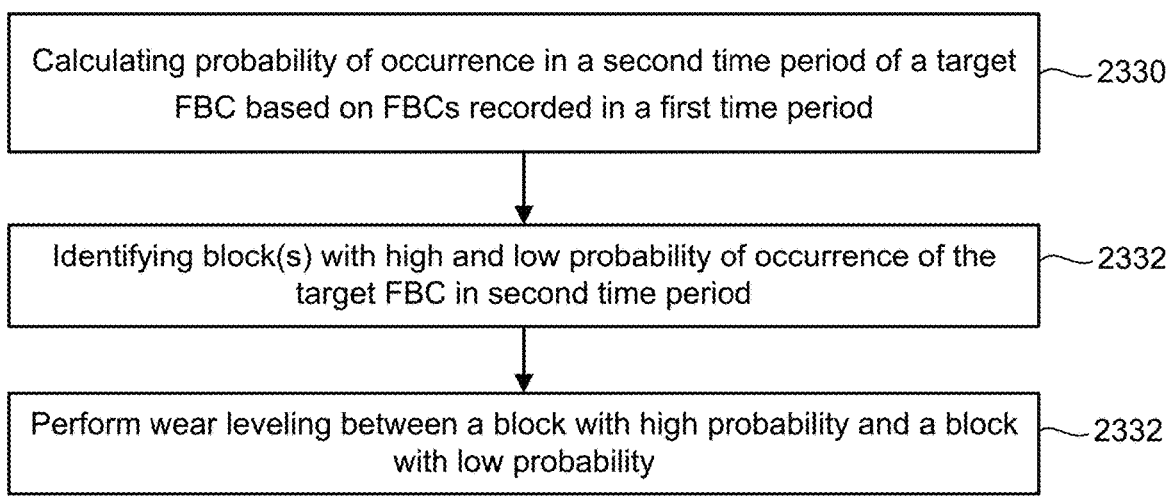
FIG. 23 illustrates an example of wear leveling according to the probability of occurrence in a second time period of a target FBC.

FIG. 23 shows an example of operating a set of non-volatile memory cells according to the probability of occurrence in a second time period of the target FBC. FIG. 23 shows calculating probability of occurrence in a second time period of a target FBC based on FBCs recorded in a first time period 2330 and identifying block(s) with high probability of occurrence of the target FBC in the second time period 2332 (e.g. as described in examples above), which are then operated differently to other blocks (e.g. operated differently to blocks with low probability of occurrence of the target FBC in the second time period). FIG. 23 also shows performing wear leveling between a block with high probability and a block with low probability 2332. Such a wear leveling scheme may be used in addition to or instead of using write-erase cycles.

The probability of occurrence of the target FBC during the second time period may also be used to adjust read threshold voltages of a block of non-volatile memory cells based on a high probability of occurrence of the target FBC in the second time period in the block of non-volatile memory cells. Thus, for example, a high probability may indicate that read threshold voltages are not optimal and that adjustment may be beneficial. Thus, read voltage adjustment may be triggered at a time when a block's probability of having a target FBC reaches a threshold. Furthermore, the scale of such change and/or changes to other operating parameters may be dependent on an FBC prediction.

Figure 24:
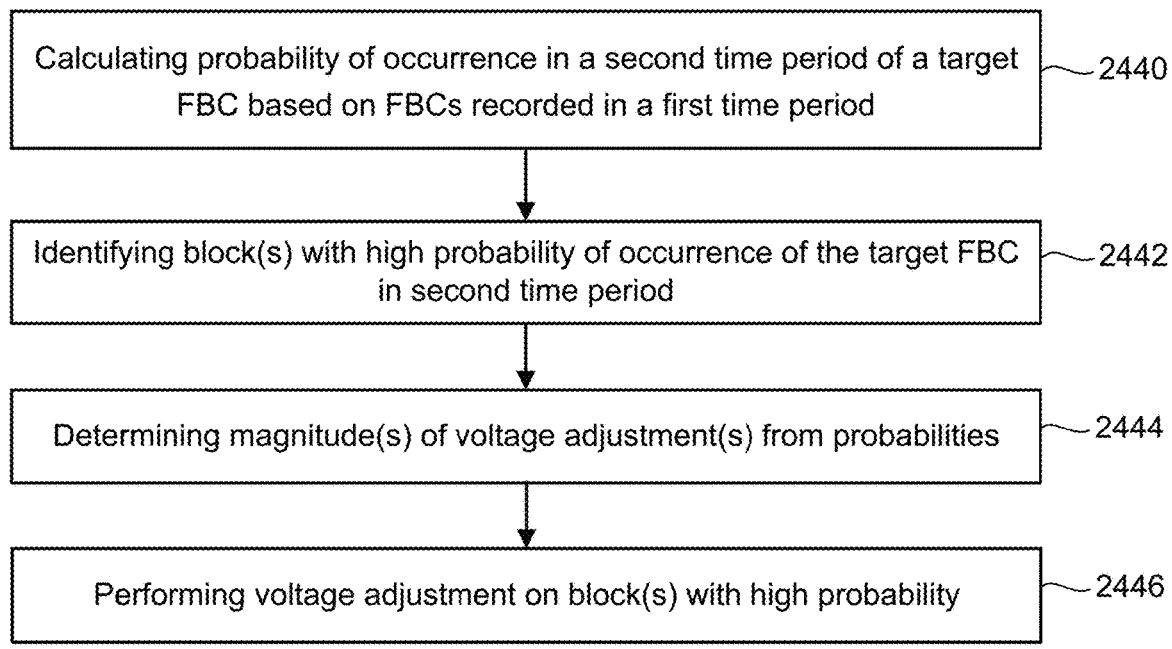
FIG. 24 illustrates an example of performing voltage adjustment according to the probability of occurrence in a second time period of a target FBC.
Figure 25:
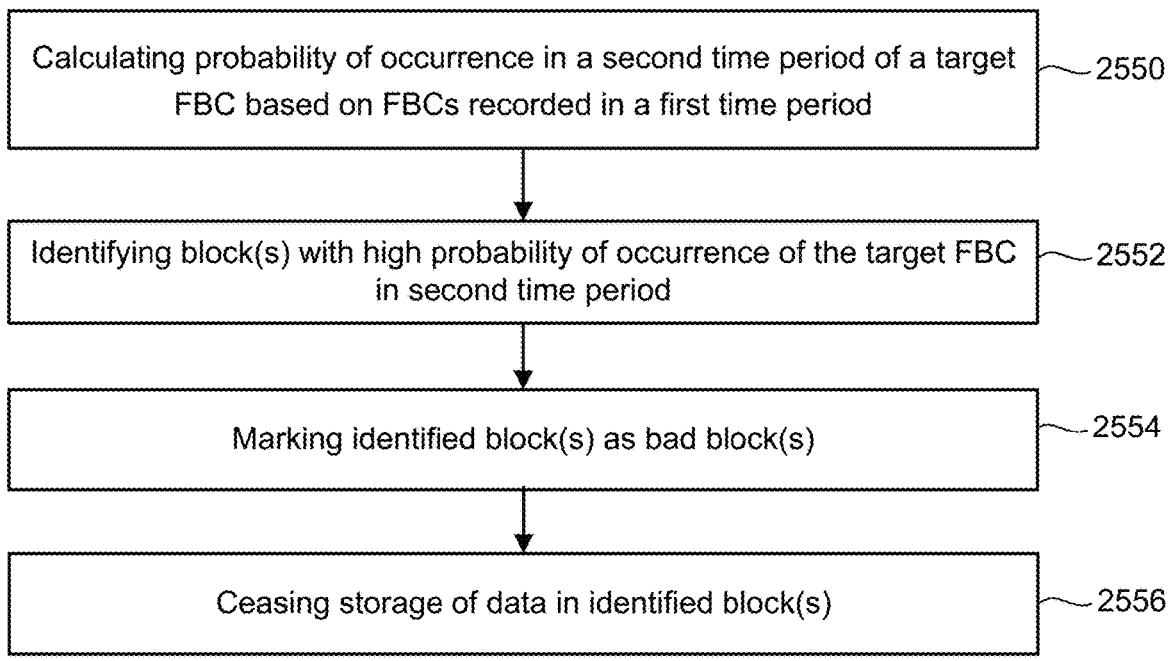
FIG. 25 illustrates an example of performing bad block identification according to the probability of occurrence in a second time period of a target FBC.

FIG. 24 shows an example of operating a set of non-volatile memory cells according to the probability of occurrence in a second time period of the target FBC. FIG. 24 shows calculating probability of occurrence in a second time period of a target FBC based on FBCs recorded in a first time period 2440 and identifying block(s) with high probability of occurrence of the target FBC in the second time period 2442 (e.g. as described in examples above). FIG. 25 also shows determining magnitude(s) of voltage adjustment(s) from probabilities 2444 (this step is optional and, in some cases, voltage adjustments may be in fixed increments or magnitude(s) may be obtained from other sources). FIG. 24 further shows performing voltage adjustment on block(s) with high probability (e.g. modifying read voltages of blocks with high probability of occurrence of the target FBC). Thus, blocks with high probability are operated differently to other blocks.

The probability of occurrence of the target FBC (e.g. an FBC corresponding to data that is uncorrectable by ECC, or UECC) during the second time period may also be used to identify bad blocks, e.g. to identify one or more blocks as having a high probability of becoming bad blocks during the second time period. Such blocks may be designated as bad blocks when a prediction based on FBC data of the first time period indicates that the probability of a target FBC reaches a threshold in a second time period. User data may be stored in such blocks as long as corresponding probabilities are below the threshold and may cease to be stored in such blocks when they are designated as having a high probability of becoming bad blocks, i.e. such blocks may not be used once the risk is sufficiently high, even if a UECC condition has not yet occurred.

FIG. 25 shows an example of operating a set of non-volatile memory cells according to the probability of occurrence in a second time period of the target FBC. FIG. 25 shows calculating probability of occurrence in a second time period of a target FBC based on FBCs recorded in a first time period 2550 and identifying block(s) with high probability of occurrence of the target FBC in the second time period 2552 (e.g. as described in examples above). FIG. 25 also shows marking identified block(s) as bad block(s) 2554 and ceasing storage of user data in identified block(s) 2556.

Identified blocks cease operation prior to other blocks and are thus operated differently to other blocks in this example. In some cases, FBCs recorded in a first time period may be used to predict failures of blocks throughout the lifetimes of non-volatile memory dies and these predictions may be used to sort, or bin dies according to their predicted characteristics based on a relatively short testing period. FBCs recorded in a first time period may be used to predict failures of blocks and such predictions may be included in block health metrics, for example, used to determine which blocks to use when storing sensitive data (e.g. storing important, or sensitive data only in blocks with a low probability of a target FBC, prohibiting storing such data in blocks with a high probability of a target FBC).

Aspects of the technology described above may be implemented using suitable hardware including examples illustrated above. For example, ECC circuits such as ECC engine 224 or encoder 710 may be configured to generate FBCs for data read from non-volatile memory and may be considered a means for obtaining FBCs for data read from a set of non-volatile memory cells in a first time period. Statistical collection and analysis unit 712 of FIG. 7 or FIG. 16 may collect failure bit counts (FBCs) of a first time period for data read from a set of non-volatile memory cells during the first time period, obtain one or more metrics of a distribution of the FBCs of the first time period (e.g. mean and standard deviation values), and calculate a probability of occurrence in a second time period of a target FBC, the second time period subsequent to the first time period, the probability of occurrence during the second time period calculated from the one or more metrics of the distribution of the FBCs of the first time period according to a model of FBC distribution change. Statistical collection and analysis unit 712 may be configured to operate at a block level, e.g. to collect the FBCs for the data read from the non-volatile memory die and to generate a plurality of block-specific predictions of FBC probabilities for a plurality of blocks of the non-volatile memory die at one or more subsequent time periods according collected FBCs and a model of FBC distribution change of the non-volatile memory die. Statistical collection and analysis unit 712 may be considered a means for obtaining a mean and standard deviation of a cumulative distribution of the FBCs and generating one or more FBC probabilities for a subsequent second time period from mean and standard deviation of the cumulative distribution of the FBCs. Memory management circuits 716 may operate a set of non-volatile memory cells according to the probability of occurrence in the second time period of the target FBC. Memory management circuits 716 and/or its components including garbage collection circuits 1660, wear leveling circuits 1662, bad block identification circuits 1664, read scrub circuits 1666, voltage adjustment circuits 1668, and/or other components may be considered individually or collectively as means for modifying one or more operation directed to a set of non-volatile memory cells according to the one or more FBC probabilities.

An example of a non-volatile storage apparatus includes a set of non-volatile memory cells and one or more control circuits in communication with the set of non-volatile memory cells, the one or more control circuits are configured to collect failure bit counts (FBCs) for data read from the set of non-volatile memory cells in a first time period and manage the set of non-volatile memory cells according to a probability of occurrence of a target FBC in a second time period that is subsequent to the first time period, the probability of occurrence of the target FBC during the second time period calculated from a model of FBC distribution change of the set of non-volatile memory cells.

The non-volatile storage apparatus may include Error Correction Code (ECC) circuits configured to generate the FBCs for the data read from the set of non-volatile memory cells in the first time period. The set of non-volatile memory cells may be comprised of a plurality of blocks of non-volatile memory cells, a block of non-volatile memory cells forming a unit of erase, the one or more control circuits configured to use the probability of occurrence of the target FBC for the second time period to determine an order for garbage collection of the plurality of blocks of non-volatile memory cells containing obsolete data. The set of non-volatile memory cells may be comprised of a plurality of blocks of non-volatile memory cells, a block of non-volatile memory cells forming a unit of erase, the one or more control circuits configured to use probabilities of occurrence of the target FBC for the second time period to identify a first block of non-volatile memory cells and a second block of non-volatile memory cells for a wear leveling operation to move data from the first block of non-volatile memory cells to the second block of non-volatile memory cells, the first block of non-volatile memory cells having a higher probability of occurrence of the target FBC in the second time period than the second block of non-volatile memory cells. The set of non-volatile memory cells may include a plurality of blocks of non-volatile memory cells, a block of non-volatile memory cells forming a unit of erase, and the one or more control circuits may be configured to adjust read threshold voltages of a block of non-volatile memory cells based on a high probability of occurrence of the target FBC in the second time period in the block of non-volatile memory cells. The set of non-volatile memory cells may be comprised of a plurality of blocks of non-volatile memory cells, a block of non-volatile memory cells forming a unit of erase, the one or more control circuits may be configured to use probabilities of occurrence of the target FBC for the second time period to identify one or more blocks of the plurality of blocks as having a high probability of becoming bad blocks during the second time period. The one or more control circuits may be further configured to store user data in the one or more blocks when corresponding probabilities of occurrence of the target FBC are below a threshold and cease to store user data in the one or more blocks when corresponding probabilities of occurrence of the target FBC are above the threshold. The model of FBC distribution change of the set of non-volatile memory cells may include estimated changes in mean and standard deviation of the FBC distribution of the set of non-volatile memory cells between the first time period and the second time period. The set of non-volatile memory cells may form a non-volatile memory that is monolithically formed in one or more physical levels of arrays of memory cells having an active area disposed above a silicon substrate.

An example of a method includes collecting failure bit counts (FBCs) of a first time period for data read from a set of non-volatile memory cells during the first time period, obtaining one or more metrics of a distribution of the FBCs of the first time period, calculating a probability of occurrence in a second time period of a target FBC, the second time period subsequent to the first time period, the probability of occurrence during the second time period calculated from the one or more metrics of the distribution of the FBCs of the first time period according to a model of FBC distribution change, and operating the set of non-volatile memory cells according to the probability of occurrence in the second time period of the target FBC such that a subset of non-volatile memory cells of the set of non-volatile memory cells with a high probability of occurrence in the second time period of the target FBC is operated differently from other non-volatile memory cells of the set of non-volatile memory cells.

Operating the set of non-volatile memory cells according to the probability of occurrence in the second time period of the target FBC may include performing at least one of: garbage collection, wear leveling, bad block identification, and read threshold voltage adjustment of the set of non-volatile memory cells according to the probability of occurrence in the second time period of the target FBC. The method may further include recording FBCs for a plurality of blocks of non-volatile memory cells of the set of non-volatile memory cells and calculating a probability of occurrence during the second time period of the target FBC for each block of the plurality of blocks of non-volatile memory cells. The first time period may be an initialization period and the second time period may be a period after substantial use of the set of non-volatile memory cells. The method may include obtaining a mean and standard deviation of the distribution of FBCs of the first time period and calculating the probability of occurrence during the second time period of the target FBC by applying the model of FBC distribution change including mean and standard deviation change to obtain a distribution of FBCs of the second time period. The method may further include generating the model of FBC distribution change including mean and standard deviation change from modeling of at least one of: data retention, program disturb, and read disturb effects. Applying the model of FBC distribution change to obtain a distribution of FBCs of the second time period may include applying a mean offset to a mean FBC of the distribution of the FBCs of the first time period and applying a standard deviation offset to an FBC standard deviation of the first time period. Applying the model of FBC distribution change to obtain a distribution of FBCs of the second time period may include calculating a predicted mean of the second time period from:

$$MEANPREDICTED(MEAN_0, PD_0, DR_0, PD_f, DR_f) =$$
$$MEAN_0 + \left(1 + \alpha \cdot \frac{MEAN_0 - MEANCURVE(PD_0, DR_0)}{MEANCURVE(PD_0, DR_0)}\right) \cdot$$
$$(MEANCURVE(PD_f, DR_f) - MEANCURVE(PD_0, DR_0))$$

where $MEANPREDICTED(MEAN_0, PD_0, DR_0, PD_f, DR_f)$ is the predicted mean of the second time period, $MEAN_0$ is the mean of the distribution of FBCs of the first time period, $PD_0$ is a program disturb value of the first time period, $DR_0$ is a data retention value of the first time period, $PD_f$ is a program disturb value of the second time period, $DR_f$ is a data retention value of the second time period, $MEANCURVE(PD, DR)$ is a function of program disturb values and data retention values, and $\alpha$ is a tuning factor. Applying the model of FBC distribution change to obtain the distribution of FBCs of the second time period may further include calculating a predicted standard deviation of the second time period from:

$$STDPREDICTED(STD_0, PD_0, DR_0, PD_f, DR_f) =$$
$$STD_0 + \left(1 + \beta \cdot \frac{STD_0 - STDCURVE(PD_0, DR_0)}{STDCURVE(PD_0, DR_0)}\right) \cdot$$
$$(STDCURVE(PD_f, DR_f) - STDCURVE(PD_0, DR_0))$$

where $STDPREDICTED(STD_0, PD_0, DR_0, PD_f, DR_f)$ is the predicted standard deviation of the second time period, $STD_0$ is a standard deviation of the distribution of FBCs of the first time period, $STDCURVE(PD,DR)$ is a function of program disturb values and data retention values, and $\beta$ is a tuning factor.

An example of a system includes a set of non-volatile memory cells, means for obtaining failure bit counts (FBCs) for data read from the set of non-volatile memory cells in a first time period, means for obtaining a mean and standard deviation of a cumulative distribution of the FBCs and generating one or more FBC probabilities for a subsequent second time period from mean and standard deviation of the cumulative distribution of the FBCs, and means for modifying one or more operation directed to the set of non-volatile memory cells according to the one or more FBC probabilities.

The system may include means for performing at least one of: garbage collection, wear leveling, and read threshold voltage adjustment, of the set of non-volatile memory cells according to the one or more FBC probabilities obtained from one or more indicators.

An example of a system includes a non-volatile memory die, a controller coupled to the non-volatile memory die, the controller comprising: Error Correction Code (ECC) circuits configured to generate Failure Bit Counts (FBCs) for data read from the non-volatile memory die; and a statistical collection and analysis unit in communication with the ECC circuits, the statistical collection and analysis unit configured to collect the FBCs for the data read from the non-volatile memory die and to generate a plurality of block-specific predictions of FBC probabilities for a plurality of blocks of the non-volatile memory die at one or more subsequent time periods according collected FBCs and a model of FBC distribution change of the non-volatile memory die.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:
a set of non-volatile memory cells including of a plurality of blocks of non-volatile memory cells, a block of non-volatile memory cells forming a unit of erase; and
one or more control circuits in communication with the set of non-volatile memory cells, the one or more control circuits are configured to collect failure bit counts (FBCs) for data read from the set of non-volatile memory cells in a first time period and manage the set of non-volatile memory cells according to a probability of occurrence of a target FBC in a second time period that is subsequent to the first time period, the probability of occurrence of the target FBC during the second time period calculated by applying a model of FBC distribution change of the set of non-volatile memory cells to the collected FBCs for data read from the set of non-volatile memory cells in the first time period, the one or more control circuits further configured to use probabilities of occurrence of the target FBC for the second time period to identify one or more blocks of the plurality of blocks as having a probability that is above a threshold probability of becoming bad blocks during the second time period, and cease to store user data in the one or more blocks in response to corresponding probability of occurrence of the target FBC above the threshold probability.

2. The non-volatile storage apparatus of claim 1 further comprising Error Correction Code (ECC) circuits configured to generate the FBCs for the data read from the set of non-volatile memory cells in the first time period.

3. The non-volatile storage apparatus of claim 1, wherein the one or more control circuits are configured to use the probability of occurrence of the target FBC for the second time period to determine an order for garbage collection of the plurality of blocks of non-volatile memory cells containing obsolete data.

4. The non-volatile storage apparatus of claim 1, wherein the one or more control circuits are configured to use probabilities of occurrence of the target FBC for the second time period to identify a first block of non-volatile memory cells and a second block of non-volatile memory cells for a wear leveling operation to move data from the first block of non-volatile memory cells to the second block of non-volatile memory cells, the first block of non-volatile memory cells having a higher probability of occurrence of the target FBC in the second time period than the second block of non-volatile memory cells.

5. The non-volatile storage apparatus of claim 1, wherein the one or more control circuits are configured to adjust read threshold voltages of a block of non-volatile memory cells based on a high probability of occurrence of the target FBC in the second time period in the block of non-volatile memory cells.

6. The non-volatile storage apparatus of claim 1 wherein the model of FBC distribution change of the set of non-volatile memory cells includes estimated changes in mean and standard deviation of the FBC distribution of the set of non-volatile memory cells between the first time period and the second time period.

7. The non-volatile storage apparatus of claim 1 wherein the set of non-volatile memory cells form a non-volatile memory that is monolithically formed in one or more physical levels of arrays of memory cells having an active area disposed above a silicon substrate.

8. A method, comprising:
collecting failure bit counts (FBCs) of a first time period for data read from a set of non-volatile memory cells during the first time period;
obtaining one or more metrics including a mean and a standard deviation of a distribution of the FBCs of the first time period;
calculating a probability of occurrence in a second time period of a target FBC, the second time period subsequent to the first time period, the probability of occurrence during the second time period calculated from the one or more metrics of the distribution of the FBCs of the first time period by applying a model of FBC distribution change including mean and standard deviation change to obtain a distribution of FBCs of the second time period; and
operating the set of non-volatile memory cells according to the probability of occurrence in the second time period of the target FBC including adjusting read threshold voltages of non-volatile memory cells of a block based on a high probability of occurrence in the second time period of the target FBC in the block.

9. The method of claim 8 wherein operating the set of non-volatile memory cells according to the probability of occurrence in the second time period of the target FBC includes performing at least one of: garbage collection, wear leveling, bad block identification, and read threshold voltage adjustment of the set of non-volatile memory cells according to the probability of occurrence in the second time period of the target FBC.

10. The method of claim 8 further comprising recording FBCs for a plurality of blocks of non-volatile memory cells of the set of non-volatile memory cells and calculating a probability of occurrence during the second time period of the target FBC for each block of the plurality of blocks of non-volatile memory cells.

11. The method of claim 8 wherein the first time period is an initialization period and the second time period is a period after substantial use of the set of non-volatile memory cells.

12. The method of claim 8 further comprising ceasing to store user data in a block of non-volatile memory cells in response to probability of occurrence of the target FBC in the block in the second time period being above a threshold probability.

13. The method of claim 12 further comprising generating the model of FBC distribution change including mean and standard deviation change from modeling of at least one of: data retention, program disturb, and read disturb effects.

14. The method of claim 12 wherein applying the model of FBC distribution change to obtain a distribution of FBCs of the second time period includes applying a mean offset to a mean FBC of the distribution of the FBCs of the first time period and applying a standard deviation offset to an FBC standard deviation of the first time period.

15. The method of claim 12 wherein applying the model of FBC distribution change to obtain a distribution of FBCs of the second time period includes calculating a predicted mean of the second time period from:

$$MEANPREDICTED(MEAN_0, PD_0, DR_0, PD_f, DR_f) =$$
$$MEAN_0 + \left(1 + \alpha \cdot \frac{MEAN_0 - MEANCURVE(PD_0, DR_0)}{MEANCURVE(PD_0, DR_0)}\right) \cdot$$
$$(MEANCURVE(PD_f, DR_f) - MEANCURVE(PD_0, DR_0))$$

where MEANPREDICTED($MEAN_0$, $PD_0$, $DR_0$, $PD_f$, $DR_f$) is the predicted mean of the second time period, $MEAN_0$ is the mean of the distribution of FBCs of the first time period, $PD_0$ is a program disturb value of the first time period, $DR_0$ is a data retention value of the first time period, $PD_f$ is a program disturb value of the second time period, $DR_f$ is a data retention value of the second time period, MEANCURVE(PD, DR) is a function of program disturb values and data retention values, and $\alpha$ is a tuning factor.

16. The method of claim 15 wherein applying the model of FBC distribution change to obtain the distribution of FBCs of the second time period further includes calculating a predicted standard deviation of the second time period from:

$$STDPREDICTED(STD_0, PD_0, DR_0, PD_f, DR_f) =$$
$$STD_0 + \left(1 + \beta \cdot \frac{STD_0 - STDCURVE(PD_0, DR_0)}{STDCURVE(PD_0, DR_0)}\right) \cdot$$
$$(STDCURVE(PD_f, DR_f) - STDCURVE(PD_0, DR_0))$$

where STDPREDICTED($STD_0$, $PD_0$, $DR_0$, $PD_f$, $DR_f$) is the predicted standard deviation of the second time period, $STD_0$ is a standard deviation of the distribution of FBCs of the first time period, STDCURVE(PD,DR) is a function of program disturb values and data retention values, and $\beta$ is a tuning factor.

17. A system comprising:
means for obtaining failure bit counts (FBCs) for data read from a set of non-volatile memory cells in a first time period;
means for obtaining a mean and standard deviation of a cumulative distribution of the FBCs for data read from the set of non-volatile memory cells in the first time period and generating one or more FBC probabilities for a subsequent second time period from the mean and the standard deviation of the cumulative distribution of the FBCs by applying a model of FBC distribution change including mean and standard deviation change to obtain the one or more FBC probabilities for the subsequent second time period;
means for modifying one or more operation directed to the set of non-volatile memory cells according to the one or more FBC probabilities; and
means for performing read threshold voltage adjustment for the set of non-volatile memory cells according to the one or more FBC probabilities for the second time period.

18. The system of claim 17 further comprising means for performing at least one of: garbage collection, and wear leveling of the set of non-volatile memory cells according to the one or more FBC probabilities obtained from one or more indicators.

19. A system comprising:
a non-volatile memory die;
a controller coupled to the non-volatile memory die, the controller configured to generate Failure Bit Counts (FBCs) for data read from the non-volatile memory die, collect the FBCs for the data read from the non-volatile memory die during a period, generate a plurality of block-specific predictions of FBC probabilities for a plurality of blocks of the non-volatile memory die at one or more subsequent time periods that are subsequent to the period according to collected FBCs and a model of FBC distribution change of the non-volatile memory die, and use probabilities of occurrence of a target FBC for the one or more subsequent time periods to identify a first block and a second block of the non-volatile memory die for a wear leveling operation to move data from the first block to the second block, the first block having a higher probability of occurrence of the target FBC in the one or more subsequent time periods than the second block wherein the model of FBC distribution change of the non-volatile memory die includes estimated changes in mean and standard deviation of the FBC distribution of the set of non-volatile memory cells between the period and the one or more subsequent time periods.

20. The system of claim 19, wherein the controller is further configured to store user data in the one or more blocks of the plurality of blocks when corresponding probabilities of occurrence of the target FBC are below a threshold and cease to store user data in the one or more blocks when corresponding probabilities of occurrence of the target FBC are above the threshold.

21. The system of claim 19 wherein the controller is further configured to perform at least one of: garbage collection, wear leveling, and read threshold voltage adjustment of the set of non-volatile memory cells according to the probability of occurrence in the one or more subsequent time periods of the target FBC.

* * * * *